US008299604B2

(12) United States Patent
Datta et al.

(10) Patent No.: US 8,299,604 B2
(45) Date of Patent: Oct. 30, 2012

(54) BONDED METAL AND CERAMIC PLATES FOR THERMAL MANAGEMENT OF OPTICAL AND ELECTRONIC DEVICES

(75) Inventors: Madhav Datta, Milpitas, CA (US); Mark McMaster, Menlo Park, CA (US)

(73) Assignee: Cooligy Inc., Mountain View, CA (US)

( * ) Notice: Subject to any disclaimer, the term of this patent is extended or adjusted under 35 U.S.C. 154(b) by 323 days.

(21) Appl. No.: 12/536,402

(22) Filed: Aug. 5, 2009

(65) Prior Publication Data

US 2010/0035024 A1 Feb. 11, 2010

Related U.S. Application Data (60) Provisional application No. 61/188,078, filed on Aug. 5, 2008.

(51) Int. Cl.
*B32B 3/00* (2006.01)
*B32B 15/04* (2006.01)

(52) U.S. Cl. ......... 257/700; 257/E23.098; 257/E23.106; 257/E23.109; 257/762; 257/701; 257/758; 428/172; 428/457; 428/471; 428/472.2; 361/704; 165/185

(58) Field of Classification Search ................. 257/700, 257/701, 758, E23.098, E23.106, E23.109; 428/172, 457, 471, 472.5; 361/704; 165/185
See application file for complete search history.

(56) References Cited

U.S. PATENT DOCUMENTS

| | | | |
|---|---|---|---|
| 596,062 A | 12/1897 | Firey | |
| 2,039,593 A | 5/1936 | Hubbuch et al. | 257/256 |
| 2,087,521 A | 7/1937 | Mazzola | |
| 2,273,505 A | 2/1942 | Florian | 138/28 |
| 2,956,642 A | 10/1960 | Chaplin et al. | |
| 3,220,254 A | 11/1965 | Halbech | |
| 3,361,195 A | 1/1968 | Meyerhoff et al. | 165/80 |
| 3,491,184 A | 1/1970 | Rietdijk | |
| 3,514,967 A | 6/1970 | Vander Molen | |

(Continued)

FOREIGN PATENT DOCUMENTS

DE 3314069 A1 12/1983

(Continued)

OTHER PUBLICATIONS

International Search Report, International Application No. PCT/US09/52897, 9 pages, date of mailing Oct. 20, 2009.

(Continued)

*Primary Examiner* — A O Williams
(74) *Attorney, Agent, or Firm* — Haverstock & Owens LLP (57) ABSTRACT

A ceramic assembly includes one or more electrically and thermally conductive pads to be thermally coupled to a heat generating device, each conductive pad is electrically isolated from each other. The ceramic assembly includes a ceramic layer to provide this electrical isolation. The ceramic layer has high thermal conductivity and high electrical resistivity. A top surface and a bottom surface of the ceramic layer are each bonded to a conductive layer, such as copper, using an intermediate joining material. A brazing process is performed to bond the ceramic layer to the conductive layer via a joining layer. The joining layer is a composite of the joining material, the ceramic layer, and the conductive layer. The top conductive layer and the joining layer are etched to form the electrically isolated conductive pads. The conductive layers are bonded to the ceramic layer using a bare ceramic approach or a metallized ceramic approach.

5 Claims, 8 Drawing Sheets

U.S. PATENT DOCUMENTS

| | | | |
|---|---|---|---|
| 3,654,988 A | 4/1972 | Clayton, III | 165/17 |
| 3,771,219 A | 11/1973 | Tuzi et al. | 29/583 |
| 3,817,321 A | 6/1974 | Von Cube et al. | 165/105 |
| 3,823,572 A | 7/1974 | Cochran, Jr. | 62/160 |
| 3,852,806 A | 12/1974 | Corman et al. | 357/82 |
| 3,929,154 A | 12/1975 | Goodwin | 137/344 |
| 3,946,276 A | 3/1976 | Braun et al. | 317/100 |
| 3,948,316 A | 4/1976 | Souriau | 165/105 |
| 3,993,123 A | 11/1976 | Chu et al. | |
| 4,021,867 A | 5/1977 | Maxwell, Jr. | |
| 4,037,889 A | 7/1977 | Piatt | |
| RE29,513 E | 1/1978 | Johnson | |
| 4,109,707 A | 8/1978 | Wilson et al. | 165/46 |
| 4,138,996 A | 2/1979 | Cartland | 126/271 |
| 4,194,559 A | 3/1980 | Eastman | 165/105 |
| 4,203,488 A | 5/1980 | Johnson et al. | 165/80 B |
| 4,211,208 A | 7/1980 | Lindner | 126/400 |
| 4,235,285 A | 11/1980 | Johnson et al. | 165/80 B |
| 4,248,295 A | 2/1981 | Ernst et al. | 165/105 |
| 4,262,975 A | 4/1981 | Heshmat et al. | |
| 4,312,012 A | 1/1982 | Fresieret et al. | 357/82 |
| 4,332,291 A | 6/1982 | Mulock-Bentley | 165/76 |
| 4,345,267 A | 8/1982 | Corman et al. | 357/81 |
| 4,395,947 A | 8/1983 | Despot | |
| 4,409,079 A | 10/1983 | Miyazaki et al. | 204/192 |
| 4,416,324 A | 11/1983 | Sutoh et al. | |
| 4,450,472 A | 5/1984 | Tuckerman et al. | 357/82 |
| 4,467,861 A | 8/1984 | Kiseev et al. | 165/104.22 |
| 4,485,429 A | 11/1984 | Mittal | 361/386 |
| 4,494,171 A | 1/1985 | Bland et al. | 361/386 |
| 4,497,875 A | 2/1985 | Arakawa et al. | 428/620 |
| 4,516,632 A | 5/1985 | Swift et al. | 165/167 |
| 4,540,115 A | 9/1985 | Hawrylo | 228/123 |
| 4,561,040 A | 12/1985 | Eastman et al. | 361/385 |
| 4,567,505 A | 1/1986 | Pease et al. | 357/81 |
| 4,573,067 A | 2/1986 | Tuckerman et al. | 357/82 |
| 4,574,876 A | 3/1986 | Aid | 165/46 |
| 4,644,385 A | 2/1987 | Nakanishi et al. | 357/82 |
| 4,664,181 A | 5/1987 | Sumberg | 165/104.13 |
| 4,675,783 A | 6/1987 | Murase | 361/385 |
| 4,687,167 A | 8/1987 | Skalka et al. | |
| 4,693,307 A | 9/1987 | Scarselletta | |
| 4,716,494 A | 12/1987 | Bright et al. | 361/386 |
| 4,758,926 A | 7/1988 | Herrell et al. | 361/385 |
| 4,793,405 A | 12/1988 | Diggelmann et al. | 165/104.33 |
| 4,866,570 A | 9/1989 | Porter | 361/382 |
| 4,868,712 A | 9/1989 | Woodman | 361/388 |
| 4,893,174 A | 1/1990 | Yamada et al. | 357/82 |
| 4,894,709 A | 1/1990 | Phillips et al. | 357/82 |
| 4,896,719 A | 1/1990 | O'Neill et al. | 165/170 |
| 4,908,112 A | 3/1990 | Pace | 204/299 R |
| 4,938,280 A | 7/1990 | Clark | 165/80.4 |
| 4,978,638 A | 12/1990 | Buller et al. | 437/209 |
| 5,009,760 A | 4/1991 | Zare et al. | 204/183.3 |
| 5,016,090 A | 5/1991 | Galyon et al. | 357/82 |
| 5,016,138 A | 5/1991 | Woodman | 361/381 |
| 5,016,707 A | 5/1991 | Nguyen | |
| 5,027,611 A | 7/1991 | Doi et al. | |
| 5,036,676 A | 8/1991 | Dudley | |
| 5,043,797 A | 8/1991 | Lopes | 357/82 |
| 5,057,908 A | 10/1991 | Weber | 357/81 |
| 5,058,627 A | 10/1991 | Brannen | 138/27 |
| 5,070,040 A | 12/1991 | Pankove | 437/209 |
| 5,083,194 A | 1/1992 | Bartilson | 357/81 |
| 5,088,005 A | 2/1992 | Ciaccio | 361/385 |
| 5,099,311 A | 3/1992 | Bonde et al. | 357/82 |
| 5,099,910 A | 3/1992 | Walpole et al. | 165/80.4 |
| 5,105,430 A | 4/1992 | Mundinger et al. | 372/35 |
| 5,125,451 A | 6/1992 | Matthews | 165/80.4 |
| 5,131,233 A | 7/1992 | Cray et al. | 62/64 |
| 5,142,970 A | 9/1992 | ErkenBrack | 99/472 |
| 5,145,001 A | 9/1992 | Valenzuela | 165/164 |
| 5,161,089 A | 11/1992 | Chu et al. | 361/385 |
| 5,199,487 A | 4/1993 | DiFrancesco et al. | 165/168 |
| 5,203,401 A | 4/1993 | Hamburgen et al. | 165/80.4 |
| 5,218,515 A | 6/1993 | Bernhardt | 361/385 |
| 5,228,502 A | 7/1993 | Chu et al. | 165/80.4 |
| 5,232,047 A | 8/1993 | Matthews | 165/168 |
| 5,239,200 A | 8/1993 | Messina et al. | 257/714 |
| 5,239,443 A | 8/1993 | Fahey et al. | 361/689 |
| 5,263,251 A | 11/1993 | Matthews | 29/840.036 |
| 5,265,670 A | 11/1993 | Zingher | 165/80.4 |
| 5,269,372 A | 12/1993 | Chu et al. | |
| 5,275,237 A | 1/1994 | Rolfson et al. | 165/80.5 |
| 5,294,834 A | 3/1994 | Fatemi et al. | 257/745 |
| 5,299,635 A | 4/1994 | Abraham | 165/173 |
| 5,308,429 A | 5/1994 | Bradley | 156/306.6 |
| 5,309,319 A | 5/1994 | Messina | 361/699 |
| 5,310,440 A | 5/1994 | Zingher | 156/345 |
| 5,316,077 A | 5/1994 | Reichard | 165/104.28 |
| 5,317,805 A | 6/1994 | Hoopman et al. | 29/890.03 |
| 5,325,265 A | 6/1994 | Turlik et al. | 361/702 |
| 5,346,000 A | 9/1994 | Schlitt | 165/104.26 |
| 5,354,415 A * | 10/1994 | Fushii et al. | 216/13 |
| 5,380,956 A | 1/1995 | Loo et al. | 174/252 |
| 5,383,340 A | 1/1995 | Larson et al. | 62/259.2 |
| 5,386,143 A | 1/1995 | Fitch | 257/715 |
| 5,388,635 A | 2/1995 | Gruber et al. | 165/80.4 |
| 5,397,919 A | 3/1995 | Tata et al. | 257/717 |
| 5,421,943 A | 6/1995 | Tam et al. | 156/273.9 |
| 5,427,174 A | 6/1995 | Lomolino, Sr. et al. | 165/1 |
| 5,436,793 A | 7/1995 | Sanwo et al. | 361/689 |
| 5,459,099 A | 10/1995 | Hsu | 437/180 |
| 5,488,835 A | 2/1996 | Howenstine et al. | |
| 5,490,117 A | 2/1996 | Oda et al. | 365/226 |
| 5,508,234 A | 4/1996 | Dusablon, Sr. et al. | 437/228 |
| 5,514,832 A | 5/1996 | Dusablon, Sr. et al. | 174/15.1 |
| 5,514,906 A | 5/1996 | Love et al. | 257/712 |
| 5,520,244 A | 5/1996 | Mundinger et al. | 165/104.33 |
| 5,544,696 A | 8/1996 | Leland | 165/80.4 |
| 5,548,605 A | 8/1996 | Benett et al. | 372/36 |
| 5,564,497 A | 10/1996 | Fukuoka et al. | 165/152 |
| 5,575,929 A | 11/1996 | Yu et al. | 216/10 |
| 5,579,828 A | 12/1996 | Reed et al. | 165/83 |
| 5,585,069 A | 12/1996 | Zanzucchi et al. | 422/100 |
| 5,622,221 A | 4/1997 | Genga, Jr. et al. | |
| 5,641,400 A | 6/1997 | Kaltenbach et al. | 210/198.2 |
| 5,647,429 A | 7/1997 | Oktay et al. | |
| 5,651,414 A | 7/1997 | Susuki et al. | 165/104.14 |
| 5,658,831 A | 8/1997 | Layton et al. | 29/832 |
| 5,672,980 A | 9/1997 | Charlton et al. | 324/755 |
| 5,675,473 A | 10/1997 | McDunn et al. | 361/699 |
| 5,676,198 A | 10/1997 | Schneider et al. | |
| 5,692,558 A | 12/1997 | Hamilton et al. | 165/80.4 |
| 5,696,405 A | 12/1997 | Weld | 257/714 |
| 5,703,536 A | 12/1997 | Davis et al. | 330/289 |
| 5,704,416 A | 1/1998 | Larson et al. | 165/104.33 |
| 5,718,628 A | 2/1998 | Nakazato et al. | |
| 5,727,618 A | 3/1998 | Mundinger et al. | 165/80.4 |
| 5,731,954 A | 3/1998 | Cheon | 361/699 |
| 5,757,070 A | 5/1998 | Fritz | |
| 5,763,951 A | 6/1998 | Hamilton et al. | 257/714 |
| 5,768,104 A | 6/1998 | Salmonson et al. | 361/704 |
| 5,774,779 A | 6/1998 | Tuchinskiy | 419/2 |
| 5,800,690 A | 9/1998 | Chow et al. | 204/451 |
| 5,801,442 A | 9/1998 | Hamilton et al. | 257/714 |
| 5,810,077 A | 9/1998 | Nakamura et al. | 165/153 |
| 5,811,062 A | 9/1998 | Wegeng et al. | 422/129 |
| 5,835,345 A | 11/1998 | Staskus et al. | 361/699 |
| 5,836,750 A | 11/1998 | Cabuz | 417/322 |
| 5,847,452 A | 12/1998 | Tantoush | |
| 5,858,188 A | 1/1999 | Soane et al. | 204/454 |
| 5,862,038 A | 1/1999 | Suzuki et al. | |
| 5,863,708 A | 1/1999 | Zanzucchi et al. | 430/320 |
| 5,869,004 A | 2/1999 | Parce et al. | 422/100 |
| 5,870,823 A | 2/1999 | Bexama et al. | 29/848 |
| 5,874,795 A | 2/1999 | Sakamoto | 310/156 |
| 5,876,655 A | 3/1999 | Fisher | 264/319 |
| 5,880,017 A | 3/1999 | Schwiebert et al. | 438/613 |
| 5,880,524 A | 3/1999 | Xie | 257/704 |
| 5,882,248 A | 3/1999 | Wright et al. | 451/285 |
| 5,886,870 A | 3/1999 | Omori | 361/704 |
| 5,887,557 A | 3/1999 | Battlogg | |
| 5,896,869 A | 4/1999 | Maniscalco et al. | |
| 5,898,572 A | 4/1999 | Shennib et al. | |
| 5,901,037 A | 5/1999 | Hamilton et al. | 361/699 |
| 5,909,057 A | 6/1999 | McCormick et al. | 257/704 |

| | | | | | | | |
|---|---|---|---|---|---|---|---|
| 5,927,390 | A | 7/1999 | Lehman ............... 165/122 | 6,396,706 | B1 | 5/2002 | Wohlfarth ............... 361/760 |
| 5,936,192 | A | 8/1999 | Tauchi ............... 136/203 | 6,397,932 | B1 | 6/2002 | Calaman et al. ......... 165/80.4 |
| 5,940,270 | A | 8/1999 | Puckett ............... 361/699 | 6,400,012 | B1 | 6/2002 | Miller et al. ............ 257/712 |
| 5,942,093 | A | 8/1999 | Rakestraw et al. ....... 204/450 | 6,406,605 | B1 | 6/2002 | Moles ............... 204/601 |
| 5,945,217 | A | 8/1999 | Hanrahan ............... 428/389 | 6,415,860 | B1 | 7/2002 | Kelly et al. ............ 165/748 |
| 5,957,194 | A | 9/1999 | Azar | 6,417,060 | B2 | 7/2002 | Tavkhelidze et al. ....... 438/380 |
| 5,960,866 | A | 10/1999 | Kimura et al. ........ 165/104.33 | 6,424,531 | B1 | 7/2002 | Bhatti et al. ........... 361/704 |
| 5,963,887 | A | 10/1999 | Giorgio | 6,492,018 | B1 | 12/2002 | Guddal |
| 5,964,092 | A | 10/1999 | Tozuka et al. ............ 62/3.7 | 6,493,221 | B2 | 12/2002 | Harrison et al. |
| 5,965,001 | A | 10/1999 | Chow et al. ............ 204/600 | 6,533,840 | B2 | 3/2003 | Martin et al. |
| 5,965,813 | A | 10/1999 | Wan et al. .............. 73/204.26 | 6,639,799 | B2 | 10/2003 | Prasher et al. |
| 5,978,220 | A | 11/1999 | Frey et al. ............... 361/699 | 6,651,452 | B2 | 11/2003 | Lecke et al. |
| 5,997,713 | A | 12/1999 | Beetz, Jr. et al. ........ 204/124 | 6,657,860 | B2 | 12/2003 | Matsui et al. |
| 5,998,240 | A | 12/1999 | Hamilton et al. ........ 438/122 | 6,679,315 | B2 | 1/2004 | Cosley et al. ........... 165/80.4 |
| 6,007,309 | A | 12/1999 | Hartley ............... 417/322 | 6,680,044 | B1 | 1/2004 | Tonkovich et al. ......... 423/652 |
| 6,010,316 | A | 1/2000 | Haller et al. ............ 417/322 | 6,729,383 | B1 | 5/2004 | Cannell et al. ............ 165/80.3 |
| 6,013,164 | A | 1/2000 | Paul et al. ............ 204/450 | 6,743,664 | B2 | 6/2004 | Liang et al. ............ 438/124 |
| 6,014,312 | A | 1/2000 | Schulz-Harder et al. ..... 361/699 | 6,757,169 | B2 | 6/2004 | Kondo et al. |
| 6,019,165 | A | 2/2000 | Batchelder ............ 165/80.3 | 6,775,137 | B2 | 8/2004 | Chu et al. |
| 6,019,882 | A | 2/2000 | Paul et al. ............ 204/450 | 6,775,996 | B2 | 8/2004 | Cowans ............... 62/160 |
| 6,021,045 | A | 2/2000 | Johnson ............... 361/704 | 6,787,052 | B1 | 9/2004 | Vaganov ............... 216/57 |
| 6,031,751 | A | 2/2000 | Janko | 6,787,899 | B2 | 9/2004 | Rinella et al. .......... 257/712 |
| 6,034,872 | A | 3/2000 | Chrysler et al. ......... 361/699 | 6,796,372 | B2 | 9/2004 | Bear |
| 6,039,114 | A | 3/2000 | Becker et al. ........... 165/170 | 6,807,056 | B2 | 10/2004 | Kondo et al. |
| 6,054,034 | A | 4/2000 | Soane et al. ............ 204/601 | 6,819,563 | B1 | 11/2004 | Chu et al. |
| 6,058,014 | A | 5/2000 | Choudhury et al. ....... 361/704 | 6,863,117 | B2 | 3/2005 | Valenzuela ........... 165/104.26 |
| 6,068,752 | A | 5/2000 | Dubrow et al. .......... 204/604 | 6,881,039 | B2 | 4/2005 | Corbin et al. ............ 417/48 |
| 6,069,791 | A | 5/2000 | Goto et al. | 6,882,543 | B2 | 4/2005 | Kenny, Jr. et al. ......... 361/764 |
| 6,084,178 | A | 7/2000 | Cromwell ............... 174/35 | 6,896,612 | B1 | 5/2005 | Novotny |
| 6,086,330 | A | 7/2000 | Press et al. ............ 416/223 | 6,914,779 | B2 | 7/2005 | Askeland et al. |
| 6,090,251 | A | 7/2000 | Sundberg et al. ......... 204/453 | 6,924,981 | B2 | 8/2005 | Chu et al. |
| 6,096,656 | A | 8/2000 | Matzke et al. ........... 438/702 | 6,940,298 | B2 | 9/2005 | Gutfeldt et al. |
| 6,100,541 | A | 8/2000 | Nagle et al. ............ 250/573 | 6,945,324 | B2 | 9/2005 | Weng |
| 6,101,715 | A | 8/2000 | Fuesser et al. ........ 29/890.03 | 6,955,212 | B1 | 10/2005 | Hsieh |
| 6,105,373 | A | 8/2000 | Watanabe et al. .......... 62/3.7 | 6,973,801 | B1 | 12/2005 | Campbell et al. |
| 6,119,729 | A | 9/2000 | Oberholzer ............ 138/27 | 6,986,382 | B2 | 1/2006 | Upadhya et al. ........... 165/80.4 |
| 6,126,723 | A | 10/2000 | Drost et al. .............. 96/4 | 6,988,534 | B2 | 1/2006 | Kenny et al. ........... 165/80.4 |
| 6,129,145 | A | 10/2000 | Yamamoto et al. ........ 165/168 | 6,988,535 | B2 | 1/2006 | Upadhya et al. ........... 165/80.4 |
| 6,129,260 | A | 10/2000 | Andrus et al. ........... 228/180 | 6,994,151 | B2 | 2/2006 | Zhou et al. ............ 165/80.4 |
| 6,131,650 | A | 10/2000 | North et al. ............. 165/170 | 7,000,684 | B2 | 2/2006 | Kenny et al. ........... 165/80.4 |
| 6,140,860 | A | 10/2000 | Sandhu et al. ........... 327/513 | 7,017,654 | B2 | 3/2006 | Kenny et al. ........... 165/80.4 |
| 6,146,103 | A | 11/2000 | Lee et al. ............... 417/50 | 7,019,972 | B2 | 3/2006 | Kenny, Jr. et al. ......... 361/699 |
| 6,154,363 | A | 11/2000 | Chang ............... 361/699 | 7,021,369 | B2 | 4/2006 | Werner et al. ........... 165/104.33 |
| 6,159,353 | A | 12/2000 | West et al. ............ 204/601 | 7,044,196 | B2 | 5/2006 | Shook et al. ............ 165/80.3 |
| 6,166,907 | A | 12/2000 | Chien | 7,050,308 | B2 | 5/2006 | Kenny, Jr. et al. ......... 361/764 |
| 6,167,948 | B1 | 1/2001 | Thomas ............ 165/104.26 | 7,051,802 | B2 | 5/2006 | Baer |
| 6,174,675 | B1 | 1/2001 | Chow et al. ............ 435/6 | 7,061,104 | B2 | 6/2006 | Kenny, Jr. et al. ......... 257/714 |
| 6,176,962 | B1 | 1/2001 | Soane et al. ............ 156/292 | 7,077,634 | B2 | 7/2006 | Munch et al. ........... 417/474 |
| 6,186,660 | B1 | 2/2001 | Kopf-Sill et al. ......... 366/340 | 7,086,839 | B2 | 8/2006 | Kenny et al. ........... 417/48 |
| 6,196,307 | B1 | 3/2001 | Ozmat ............... 165/185 | 7,090,001 | B2 | 8/2006 | Zhou et al. ........... 165/104.21 |
| 6,206,022 | B1 | 3/2001 | Tsai et al. ............ 137/15.18 | 7,104,312 | B2 | 9/2006 | Goodson et al. ........... 165/80.4 |
| 6,216,343 | B1 | 4/2001 | Leland et al. .......... 29/890.032 | 7,143,816 | B1 | 12/2006 | Ghosh et al. |
| 6,221,226 | B1 | 4/2001 | Kopf-Sill ............... 204/450 | 7,156,159 | B2 | 1/2007 | Lovette et al. ........... 165/104.33 |
| 6,227,287 | B1 | 5/2001 | Tanaka et al. .......... 165/80.4 | 7,178,512 | B1 | 2/2007 | Merten |
| 6,227,809 | B1 | 5/2001 | Forster et al. ............ 417/53 | 7,188,662 | B2 | 3/2007 | Brewer et al. ............ 165/80.4 |
| 6,234,240 | B1 | 5/2001 | Cheon ............... 165/80.3 | 7,190,583 | B1 | 3/2007 | Fendley et al. |
| 6,238,538 | B1 | 5/2001 | Parce et al. ............ 204/600 | 7,201,012 | B2 | 4/2007 | Munch et al. ........... 62/259.2 |
| 6,253,832 | B1 | 7/2001 | Hallefalt ............... 164/502 | 7,201,214 | B2 | 4/2007 | Munch et al. ........... 165/82 |
| 6,253,835 | B1 | 7/2001 | Chu et al. ............ 165/80.4 | 7,221,858 | B2 | 5/2007 | Ku |
| 6,253,836 | B1 | 7/2001 | Mitchell ............... 165/86 | 7,233,494 | B2 | 6/2007 | Campbell et al. |
| 6,257,320 | B1 | 7/2001 | Wargo ............... 165/80.4 | 7,278,549 | B2 | 10/2007 | Munch et al. ........... 220/721 |
| 6,277,257 | B1 | 8/2001 | Paul et al. ............ 204/450 | 7,293,423 | B2 | 11/2007 | Upadhya et al. ........... 62/150 |
| 6,301,109 | B1 | 10/2001 | Chu et al. ............ 361/690 | 7,295,444 | B1 | 11/2007 | Wang |
| 6,313,992 | B1 | 11/2001 | Hildebrandt ............ 361/700 | 7,301,773 | B2 | 11/2007 | Brewer et al. ............ 361/719 |
| 6,317,326 | B1 | 11/2001 | Vogel et al. ............. 361/704 | 7,342,789 | B2 | 3/2008 | Hall et al. ............... 361/701 |
| 6,321,791 | B1 | 11/2001 | Chow ............... 137/833 | 7,344,363 | B2 | 3/2008 | Munch et al. ........... 417/481 |
| 6,322,753 | B1 | 11/2001 | Lindberg et al. ........ 422/102 | 7,385,810 | B2 | 6/2008 | Chu et al. |
| 6,324,058 | B1 | 11/2001 | Hsaio ............... 361/699 | 7,398,821 | B2 | 7/2008 | Rainer et al. |
| 6,324,075 | B1 | 11/2001 | Unrein et al. ............ 361/816 | 7,402,029 | B2 | 7/2008 | Munch et al. ........... 417/474 |
| 6,337,794 | B1 | 1/2002 | Agonafer et al. .......... 361/690 | 7,430,118 | B1 | 9/2008 | Noteboom et al. |
| 6,351,384 | B1 | 2/2002 | Darkoku et al. .......... 361/704 | 7,434,412 | B1 | 10/2008 | Miyahira et al. |
| 6,355,505 | B1 | 3/2002 | Maeda et al. | 7,449,122 | B2 | 11/2008 | Corbin et al. ............ 216/2 |
| 6,360,814 | B1 | 3/2002 | Tanaka et al. .......... 165/104.33 | 7,455,103 | B2 | 11/2008 | Sato et al. |
| 6,362,958 | B1 | 3/2002 | Yu et al. | 7,462,852 | B2 | 12/2008 | Appleby et al. ........... 250/505.1 |
| 6,366,462 | B1 | 4/2002 | Chu et al. ............ 361/699 | 7,591,302 | B1 | 9/2009 | Lenehan et al. |
| 6,366,467 | B1 | 4/2002 | Patel et al. ............ 361/760 | 7,666,215 | B2 | 2/2010 | Callister et al. |
| 6,367,544 | B1 | 4/2002 | Calaman ............ 165/135 | 2002/0011330 | A1 | 1/2002 | Insley et al. |
| 6,381,813 | B1 | 5/2002 | Lai ............... 24/456 | 2002/0075645 | A1 | 6/2002 | Kitano et al. |
| 6,388,317 | B1 | 5/2002 | Reese ............... 257/713 | 2002/0080578 | A1 | 6/2002 | Xie |

| | | | |
|---|---|---|---|
| 2003/0077474 A1 | 4/2003 | Rabinkin et al. | 428/59 |
| 2003/0205363 A1 | 11/2003 | Chu et al. | 165/80.3 |
| 2004/0008483 A1 | 1/2004 | Cheon | |
| 2004/0012927 A1 | 1/2004 | Lee et al. | |
| 2004/0050538 A1 | 3/2004 | Sunder et al. | |
| 2004/0105234 A1 | 6/2004 | Messina et al. | |
| 2004/0188059 A1 | 9/2004 | Todd, Jr. et al. | |
| 2004/0188076 A1 | 9/2004 | Lee | 165/174 |
| 2004/0206477 A1 | 10/2004 | Kenny et al. | 165/80.4 |
| 2004/0216863 A1 | 11/2004 | Hu | 165/110 |
| 2004/0221603 A1 | 11/2004 | Arik et al. | |
| 2004/0221604 A1 | 11/2004 | Ota et al. | 62/259.2 |
| 2004/0228091 A1 | 11/2004 | Miyairi | |
| 2005/0024832 A1 | 2/2005 | Lee et al. | |
| 2005/0029242 A1 | 2/2005 | Bonnet et al. | |
| 2005/0041393 A1 | 2/2005 | Tustaniwski et al. | |
| 2005/0061013 A1 | 3/2005 | Bond | |
| 2005/0133200 A1 | 6/2005 | Malone et al. | 165/80.4 |
| 2005/0174737 A1 | 8/2005 | Meir | |
| 2005/0247433 A1 | 11/2005 | Corrado et al. | 165/80.4 |
| 2005/0259393 A1 | 11/2005 | Vinson et al. | 361/690 |
| 2006/0037739 A1 | 2/2006 | Utsunomiya | 165/104.33 |
| 2006/0120039 A1 | 6/2006 | Yuval | 361/694 |
| 2006/0137870 A1 | 6/2006 | Ohhashi et al. | |
| 2006/0139882 A1 | 6/2006 | Mikubo et al. | 361/699 |
| 2006/0171113 A1 | 8/2006 | Wu | 361/687 |
| 2006/0187639 A1 | 8/2006 | Carswell | 361/699 |
| 2006/0232945 A1 | 10/2006 | Chu et al. | 361/724 |
| 2006/0245987 A1 | 11/2006 | Schmidt | |
| 2007/0006460 A1 | 1/2007 | Kim | |
| 2007/0039719 A1 | 2/2007 | Eriksen | |
| 2007/0042514 A1 | 2/2007 | Wu et al. | 438/17 |
| 2007/0053161 A1 | 3/2007 | Giardina et al. | 361/700 |
| 2007/0098143 A1 | 5/2007 | Thangamani et al. | 378/130 |
| 2007/0109739 A1 | 5/2007 | Stefanoski | |
| 2007/0152352 A1 | 7/2007 | McKinnell et al. | |
| 2007/0164088 A1 | 7/2007 | Dianatkhah | |
| 2007/0175621 A1* | 8/2007 | Datta et al. | 165/185 |
| 2007/0211428 A1 | 9/2007 | Doll, Jr. | |
| 2007/0227708 A1 | 10/2007 | Hom et al. | |
| 2007/0235167 A1 | 10/2007 | Brewer et al. | |
| 2007/0266714 A1 | 11/2007 | Fielder | |
| 2007/0267181 A1 | 11/2007 | Lin et al. | 165/104.33 |
| 2007/0297136 A1 | 12/2007 | Konshak | 361/699 |
| 2008/0023180 A1 | 1/2008 | Bunker et al. | |
| 2008/0024992 A1 | 1/2008 | Pflueger | 361/705 |
| 2008/0110963 A1 | 5/2008 | Lin et al. | |
| 2008/0285228 A1 | 11/2008 | Koch et al. | |
| 2009/0159241 A1 | 6/2009 | Lipp et al. | |
| 2009/0183520 A1 | 7/2009 | Yukimoto | |
| 2009/0225513 A1 | 9/2009 | Correa et al. | |
| 2009/0262495 A1 | 10/2009 | Neudorfer | |
| 2010/0032143 A1* | 2/2010 | Datta et al. | 165/104.33 |
| 2010/0132640 A1 | 6/2010 | Methley et al. | |
| 2011/0073292 A1 | 3/2011 | Datta et al. | |

FOREIGN PATENT DOCUMENTS

| | | |
|---|---|---|
| DE | 3314069 A | 11/1986 |
| DE | 3927755 A1 | 2/1991 |
| DE | 19628548 A1 | 1/1998 |
| DE | 29717480 U1 | 2/1998 |
| DE | 197 15 001 A1 | 12/1998 |
| DE | 69413012 T2 | 3/1999 |
| DE | 69511875 T2 | 3/2000 |
| DE | 10132874 A1 | 1/2003 |
| DE | 10141525 A1 | 3/2003 |
| DE | 10319667 A1 | 11/2004 |
| DE | 102004042154 A1 | 3/2006 |
| EP | 0 520 173 A2 | 12/1992 |
| EP | 0720720 B1 | 1/1998 |
| EP | 0845728 A2 | 3/1998 |
| EP | 1 003 006 A1 | 5/2000 |
| JP | 60046056 | 12/1985 |
| WO | 2005080901 A1 | 9/2005 |
| WO | 2005080901 A1 | 2/2006 |
| WO | 2007006590 A2 | 1/2007 |

OTHER PUBLICATIONS

Office action dated Oct. 6, 2010, U.S. Appl. No. 11/731,484, filed Mar. 30, 2007, 64 pages.

Office Action dated Dec. 9, 2011, U.S. Appl. No. 12/151,243, filed May 2, 2008, 10 pages.

Office action dated Jan. 6, 2012, U.S. Appl. No. 12/536,361, filed Aug. 5, 2009, Applicant: Madhav Datta, 50 pages.

Office action dated Jan. 9, 2012, U.S. Appl. No. 12/381,332, filed Mar. 10, 2009, Applicant: James Hom, 14 pages.

* cited by examiner

BONDED METAL AND CERAMIC PLATES FOR THERMAL MANAGEMENT OF OPTICAL AND ELECTRONIC DEVICES

RELATED APPLICATIONS

This application claims priority of U.S. provisional application Ser. No. 61/188,078, filed Aug. 5, 2008, and entitled "Fabrication of Microheat Exchanger for Laser Diode Cooling", by these same inventors. This application incorporates U.S. provisional application Ser. No. 61/188,078 in its entirety by reference.

FIELD OF THE INVENTION

The invention relates to a microheat exchanger and a method of fabrication of the same. More particularly, this invention relates to a microheat exchanger and a method of fabrication, where the microheat exchanger is used for laser diode cooling.

BACKGROUND OF THE INVENTION

Microheat exchangers are made of thermally conductive material and are used to transfer heat from a heat generating device, such as an integrated circuit or a laser diode, to a fluid flowing through fluid pathways within the microheat exchanger. Microheat exchangers are commonly made of metal, such as copper, and electrical isolation is often required between the heat generating device and the microheat exchanger. Some ceramic materials are thermally conductive yet electrically resistant. For this reason, such ceramic materials are often used as an intermediate material between a heat generating device and a microheat exchanger to provide electrical isolation while still maintaining thermal conductivity. However, it is not practical to connect a heat generating device directly to ceramic. Instead, the heat generating device is coupled to a conductive pad, typically made of a conductive metal such as copper. In such a configuration, the ceramic is middle layer between the conductive copper pad coupled to the heat generating device and the microheat exchanger.

In order to provide efficient heat transfer from the heat generating device to the microheat exchanger, a good thermal interface between ceramic and copper is necessary. A direct bonded copper (DBC) method uses a high temperature joining process to bond a copper sheet to a ceramic plate in the presence of a protective gas atmosphere having small amounts of oxygen (50-200 ppm). Exemplary DBC methods are described in U.S. Pat. Nos. 6,297,469 and 7,036,711, which are hereby incorporated in their entirety by reference. Three commonly used ceramic materials are beryllium oxide (BeO), aluminum oxide ($Al_2O_3$), and aluminum nitride (AlN). Oxygen and copper bond together under high temperature. The copper and ceramic are heated to a carefully controlled temperature, in an atmosphere of nitrogen and a small percentage of oxygen. The temperature used is in the range between 1950 and 1981 degrees Fahrenheit, which is close to the melting temperature of copper. Under these conditions, a copper-oxygen eutectic forms which bonds successfully both to copper and the ceramic, thereby bonding a copper layer to a ceramic layer. The copper layer is used as a conductive pad to be coupled to a heat generating device. The ceramic layer is typically soldered to the top of the microheat exchanger.

Many problems exist with bonding in general and the DBC technique in particular. First, application of high temperature to rigid ceramic plates often results in cracking of the ceramic. Second, microvoids are formed at the interface of the bonded copper and ceramic layers. The microvoids are due to the imperfections and irregularities in the contact surfaces of the copper and ceramic layers. For applications where a large heat generating device, or multiple heat generating devices are coupled to a single ceramic plate, the size of the ceramic plate is larger. However, the larger the ceramic plate, the greater the impact of the microvoids. Presence of microvoids reduces thermal efficiency. Further, presence of microvoids increases the chances that the copper layer and the ceramic layer will delaminate because there is not a perfect bond across the entire interface surface.

Third, the thermal coefficient of expansion for copper is much greater than that for ceramic. During the high temperature DBC process, the copper layer expands more so than the ceramic, at which point the ceramic layer and the copper layer are bonded. However, upon cooling the copper layer contracts more so than the ceramic, due to the differing thermal coefficients of expansion, which leads to warping and possible cracking of the bonded copper-ceramic assembly.

SUMMARY OF THE INVENTION

A microheat exchanging assembly is configured to cool one or more heat generating devices, such as integrated circuits or laser diodes. In some embodiments, the microheat exchanging assembly includes a first ceramic assembly thermally coupled to a first surface, and in some embodiments, a second ceramic assembly thermally coupled to a second surface. Each ceramic assembly includes one or more electrically and thermally conductive pads to be thermally coupled to a heat generating device, each conductive pad is electrically isolated from each other. Each ceramic assembly includes a ceramic layer to provide this electrical isolation. The ceramic layer has high thermal conductivity and high electrical resistivity. A top surface and a bottom surface of the ceramic layer are each bonded to a conductive layer, such as copper, using an intermediate joining material. A brazing process is performed to bond the ceramic layer to the conductive layer via a joining layer. The joining layer is a composite of the joining material, the ceramic layer, and the conductive layer. The top conductive layer and the joining layer are etched to form the electrically isolated conductive pads. The conductive layers are bonded to the ceramic layer using a bare ceramic approach or a metallized ceramic approach.

In one aspect, a device includes a first copper layer, a ceramic layer, a second copper layer, a first active brazing alloy bonded between the first copper layer and the ceramic layer to form a first joining layer, and a second active brazing alloy bonded between the ceramic layer and the second copper layer to form a second joining layer. In some embodiments, the ceramic layer is beryllium oxide, aluminum oxide, or aluminum nitride. In some embodiments, the first active brazing alloy layer and the second active brazing alloy layer are a copper-based active brazing alloy, a copper-silver-based active brazing alloy, or an indium-copper-silver-based active brazing alloy. In some embodiments, the first active brazing alloy layer and the second active brazing alloy layer are an active joining material paste. In other embodiments, the first active brazing alloy layer and the second active brazing alloy layer are an active joining material foil.

In another aspect, a device includes a first copper layer, a ceramic layer, a second copper layer, a first active brazing alloy layer bonded between the first copper layer and the ceramic layer to form a first joining layer, wherein the first copper layer and the first joining layer are configured to form a plurality of electrically isolated conductive pads, and a second active brazing alloy layer bonded between the ceramic layer and the second copper layer to form a second joining layer. In some embodiments, the first copper layer and the first joining layer are etched to form a plurality of electrically isolated conductive pads, further wherein each of the plurality of electrically isolated pads are electrically isolated from each other and from the second copper layer by the ceramic layer. In some embodiments, each of the plurality of electrically isolated pads includes an etched wall extending from a first surface of the first copper layer through the first copper layer and the first joining layer to a first surface of the ceramic layer, the first surface of the first copper layer is distal from the first joining layer, and the first surface of the ceramic layer is proximate to the first joining layer, further wherein a slope of the etched wall is uniform through the first copper layer and the first joining layer. In other embodiments, each of the plurality of electrically isolated pads includes an etched wall extending from a first surface of the first copper layer through the first copper layer and the first joining layer to a first surface of the ceramic layer, the first surface of the first copper layer is distal from the first joining layer, and the first surface of the ceramic layer is proximate to the first joining layer, further wherein a slope of the etched wall through the first joining layer is steeper than a slope of the etched wall through the first copper layer. In some embodiments, the ceramic layer is beryllium oxide, aluminum oxide, or aluminum nitride. In some embodiments, the first active brazing alloy layer and the second active brazing alloy layer are a copper-based active brazing alloy, a copper-silver-based active brazing alloy, or an indium-copper-silver-based active brazing alloy. In some embodiments, the first active brazing alloy layer and the second active brazing alloy layer are an active joining material paste. In other embodiments, the first active brazing alloy layer and the second active brazing alloy layer are an active joining material foil.

In yet another aspect, a device includes a first copper layer, a ceramic layer including a metallized first surface and a metallized second surface, a second copper layer, a first copper and ceramic joining layer bonded between the first copper layer and the metallized first surface of the ceramic layer to form a first joining layer, wherein the first copper layer, the first joining layer, and the metallized first surface are configured to form a plurality of electrically isolated conductive pads, and a second copper and ceramic joining layer bonded between the metallized second surface of the ceramic layer and the second copper layer to form a second joining layer. In some embodiments, the first copper layer, the first joining layer, and the metallized first surface are etched to form a plurality of electrically isolated conductive pads, further wherein each of the plurality of electrically isolated pads are electrically isolated from each other and from the second copper layer by the ceramic layer. In some embodiments, each of the plurality of electrically isolated pads includes an etched wall extending from a first surface of the first copper layer through the first copper layer, the first joining layer, and the metallized first surface, to a first surface of the ceramic layer, further wherein a slope of the etched wall is uniform through the first copper layer, the first joining layer, and the metallized first surface. In other embodiments, each of the plurality of electrically isolated pads includes an etched wall extending from a first surface of the first copper layer through the first copper layer, the first joining layer, and the metallized first surface, to a first surface of the ceramic layer, further wherein a slope of the etched wall through the first joining layer is steeper than a slope of the etched wall through the first copper layer. In some embodiments, the metallized first surface is molybdenum manganese and nickel. In some embodiments, the ceramic layer is beryllium oxide, aluminum oxide, or aluminum nitride. In some embodiments, the first copper and ceramic joining layer and the second copper and ceramic joining layer are a copper-silver paste, a copper-silver foil, a copper-gold paste, or a copper-gold foil. In some embodiments, the first copper and ceramic joining layer and the first copper layer are a first silver plated copper sheet, and the second copper and ceramic joining layer and the second copper layer are a second silver plated copper sheet.

In another aspect, a device includes a ceramic layer including a metallized first surface and a metallized second surface, a first copper layer plated to the metallized first surface, wherein the first plated copper layer and the metallized first surface are configured to form a plurality of electrically isolated conductive pads, and a second copper layer plated to the metallized second surface. In some embodiments, the first copper layer and the metallized first surface are etched to form a plurality of electrically isolated conductive pads, further wherein each of the plurality of electrically isolated pads are electrically isolated from each other and from the second copper layer by the ceramic layer. In some embodiments, each of the plurality of electrically isolated pads includes an etched wall extending from a first surface of the first copper layer through the first copper layer and the metallized first surface, to a first surface of the ceramic layer, further wherein a slope of the etched wall is uniform through the first copper layer and the metallized first surface. In some embodiments, each of the plurality of electrically isolated pads includes an etched wall extending from a first surface of the first copper layer through the first copper layer and the metallized first surface, to a first surface of the ceramic layer, further wherein a slope of the etched wall through the metallized first surface is steeper than a slope of the etched wall through the first copper layer. In some embodiments, the metallized first surface is molybdenum manganese and nickel. In some embodiments, the ceramic layer is beryllium oxide, aluminum oxide, or aluminum nitride.

Other features and advantages of the ceramic assembly will become apparent after reviewing the detailed description of the embodiments set forth below.

BRIEF DESCRIPTION OF THE DRAWINGS

The ceramic assembly is described relative to the several views of the drawings. Where appropriate and only where identical elements are disclosed and shown in more than one drawing, the same reference numeral will be used to represent such identical elements.

DETAILED DESCRIPTION OF THE PRESENT INVENTION

Reference will now be made in detail to the embodiments of the ceramic assembly, examples of which are illustrated in the accompanying drawings. While the ceramic assembly will be described in conjunction with the embodiments below, it will be understood that they are not intended to limit the ceramic assembly to these embodiments and examples. On the contrary, the ceramic assembly is intended to cover alternatives, modifications and equivalents, which may be included within the spirit and scope of the ceramic assembly as defined by the appended claims. Furthermore, in the following detailed description of the ceramic assembly, numerous specific details are set forth in order to more fully illustrate the ceramic assembly. However, it will be apparent to one of ordinary skill in the prior art that the ceramic assembly may be practiced without these specific details. In other instances, well-known methods and procedures, components and processes have not been described in detail so as not to unnecessarily obscure aspects of the ceramic assembly.

Embodiments are directed to a microheat exchanging assembly and a ceramic assembly and methods of fabricating each. The microheat exchanging assembly is configured to cool one or more heat generating devices, such as electronic devices. In some embodiments, the microheat exchanging assembly includes a plurality of electrically and thermally conductive pads, each conductive pad is electrically isolated from each other. The heat generating device is electrically and thermally coupled to the conductive pad using any conventional method, such as soldering. In an exemplary application, each pad is coupled to one of an array of laser diodes used in high power lasers for industrial cutting and marking applications. In such an application, the microheat exchanging assembly is referred to a microheat exchanger for laser diodes (MELD™). The microheat exchanging assembly is particularly applicable to those applications requiring the arrangement of multiple heat generating devices in a common plane, such as a laser diode array. By electrically isolating each conductive pad, the heat generating devices coupled to the conductive pads are electrically isolated from each other while maintaining a uniform high rate of heat transfer from each heat generating device to a microheat exchanger. To provide this electrical isolation a ceramic layer with high thermal conductivity and high electrical resistivity is used. In some embodiments, the ceramic layer is made of beryllium oxide, aluminum oxide, or aluminum nitride. A top surface and a bottom surface of the ceramic layer are each bonded to a conductive layer using an intermediate joining material. Brazing of the joining material during the bonding process enables the liquidus joining material to melt, which provides a localized "flow" of material into the microvoids on the contact surfaces of the ceramic and conductive layers, thereby improving thermal efficiency. In some embodiments, each conductive layer is copper. The top conductive layer and the intermediate joining material are etched to form the electrically isolated conductive pads. The bonded ceramic and conductive layers form a first ceramic assembly.

The bottom conductive layer of the first ceramic assembly is bonded to a top surface of a microheat exchanger through which a cooling fluid circulates. The microheat exchanger is made of a thermally conductive material. In some embodiments, the microheat exchanger is made of copper. Heat is transferred from the heat generating devices coupled to the conductive pads to the fluid flowing through the microheat exchanger.

In some embodiments, a second ceramic assembly is formed and bonded to a bottom surface of the microheat exchanger. The second ceramic assembly can also include a plurality of electrically isolated conductive pads, which can be patterned the same or differently than those on the first ceramic assembly.

Fabrication of the microheat exchanging assembly includes the general steps of fabricating the ceramic assembly, fabricating the microheat exchanger, and final assembly and brazing of the microheat exchanging assembly.

A. Fabrication of the Ceramic Assembly

A ceramic assembly is formed by bonding a conductive layer to both sides of a thin ceramic plate using an intermediate joining material. In some embodiments, each conductive layer is a copper layer. In some embodiments, the ceramic plate is made of beryllium oxide (BeO), aluminum oxide ($Al_2O_3$), or aluminum nitride (AlN). The use of BeO may find restrictions due to its toxicity. Optimum thickness of the ceramic plate is dictated by the ability to minimize heat transfer resistance while maintaining mechanical strength of the bonded layer. The heat transfer resistance is reduced as the thickness of the ceramic plate is reduced, but the mechanical strength is increased as the thickness of the ceramic plate is increased. In some embodiments, the ceramic plate thickness varies from about 100 micrometers to several millimeters. In still other embodiments, the thickness of the ceramic plate is in the range of about 0.5 mm to about 0.75 mm. The thickness of each copper layer is dictated by the extent of warping of the assembled unit and the need for grinding the copper layer for its planarization. In some embodiments, the copper layer thickness is in the range of about 0.05 mm to about 0.5 mm. In still other embodiments, the thickness of the copper layer is about 0.25 mm. In some embodiments, the surface area of the ceramic assembly is in the range of about 1250 mm$^2$ to about 8000 mm$^2$.

A requirement of the fabrication of the ceramic assembly is to provide excellent bonding of the copper layers to the ceramic plate. Other than the ceramic plate, the remaining layers of the ceramic assembly are able to be patterned by selective removal of the copper layer and joining materials for making electrically isolated patterned copper pads. Various techniques for bonding copper to both sides of a ceramic plate are disclosed. One approach is the bare ceramic approach which uses active brazing alloy (ABA) materials such as copper-based ABA (Cu-ABA); copper and silver-based ABA (CuSil-ABA); and indium, copper, and silver-based ABA (InCuSil-ABA). Each of these ABAs is copper rich, and therefore provides good thermal conductivity. Each of these ABAs include a small amount of an active ingredient to bind with ceramic. In some embodiments, each of these ABAs includes titanium (Ti) as an active ingredient. Titanium in the ABA reacts with the ceramic plate and the copper layer to provide a chemical bond, resulting in a joining layer interface formed between the copper layer and the ceramic plate. It is understood that alternative ABAs including one or more active ingredients other than titanium can be used to bind with ceramic.

Further, the use of a brazing material as the intermediate joining material provides material "flow" into the microvoids of the contact surfaces. Brazing is a joining process whereby a joining material, such as a metal or alloy, is heated to a melting temperature. At the melting temperature, the liquidus joining material interacts with a thin layer of the base metal, cooling to form a strong, sealed joint. The resulting joining layer is a blend of the ABA material, the copper layer, and the ceramic layer. The melting temperature of the braze material is lower than the melting temperature of the materials being joined. Using the brazing process to bond the ceramic layer to the copper layer, the brazing temperature is lower than a conventional temperature used to direct copper bond the two layers together. Reducing the temperature also reduces the warping effects on the cooled copper-ceramic assembly.

Table 1 shows the composition and melting temperature of some selected active brazing alloys used in the copper and ceramic bonding process:

TABLE 1

| Active Brazing Alloy | Composition | Solidus Temperature, ° F. | Liquidus Temperature, ° F. |
| --- | --- | --- | --- |
| Cu-ABA | Cu - 2.75%<br>Ti - 2.25%<br>Al - 2.00%<br>Si - 3.00% | 1756 | 1875 |
| CuSil-ABA | Ag - 63.00%<br>Cu - 32.25%<br>Ti - 1.25% | 1435 | 1500 |
| InCuSil-ABA | Ag - 59.00%<br>Cu - 27.25%<br>In - 12.50%<br>Ti - 1.25% | 1121 | 1319 |

Figure 1:
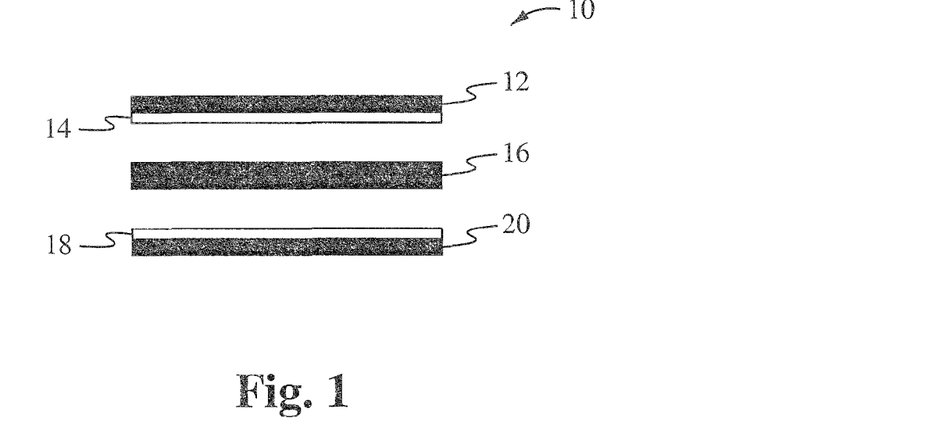
FIG. 1 illustrates a cut-out side view of exemplary layers of a ceramic assembly fabricated using a bare ceramic approach according to a first embodiment, the view shown in FIG. 1 is before a brazing process is performed.

In some embodiments, each copper layer is a copper sheet and the ABA is used in a paste form. The ABA paste can be sprayed or screen printed on either both sides of the ceramic plate or on one side of each copper sheet that is to be attached to the ceramic plate. FIG. 1 illustrates a cut-out side view of exemplary layers of a ceramic assembly 10 fabricated using a bare ceramic approach according to a first embodiment, the view shown in FIG. 1 is before a brazing process is performed. The first embodiment of the bare ceramic approach uses an ABA paste. The ABA paste can be applied either to one side of each copper sheet, as shown in FIG. 1 as ABA paste 14 applied to copper sheet 12 and ABA paste 18 applied to copper sheet 20, or to both sides of a ceramic plate 16. In some embodiments, the thickness of the ABA paste varies between several microns to 100s of microns. In still other embodiments, the thickness of the ABA paste is about 25 microns.

Figure 2:
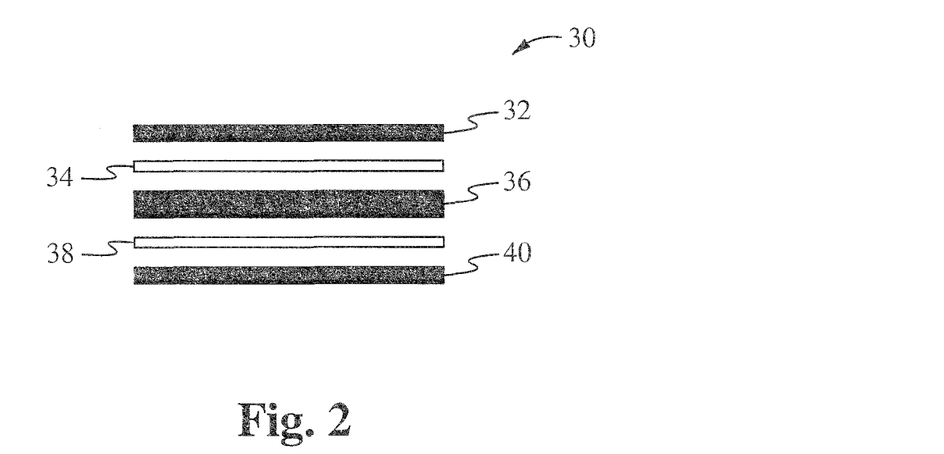
FIG. 2 illustrates a cut-out side view of exemplary layers of a ceramic assembly fabricated using a bare ceramic approach according to a second embodiment, the view shown in FIG. 1 is before a brazing process is performed.

In other embodiments, an ABA foil is placed between the ceramic plate and each copper sheet. FIG. 2 illustrates a cut-out side view of exemplary layers of a ceramic assembly 30 fabricated using a bare ceramic approach according to a second embodiment, the view shown in FIG. 1 is before a brazing process is performed. The second embodiment of the bare ceramic approach uses ABA foils. A first ABA foil 34 is positioned between one side of a ceramic plate 36 and a copper sheet 32, and a second ABA foil 38 is positioned between the other side of the ceramic plate 36 and a copper sheet 40. In some embodiments, the thickness of each ABA foil 34 and 38 is in the range of about 10 microns to about 100 microns. In still other embodiments, the thickness of each ABA foil 34 and 38 is about 25 microns.

Figure 3:
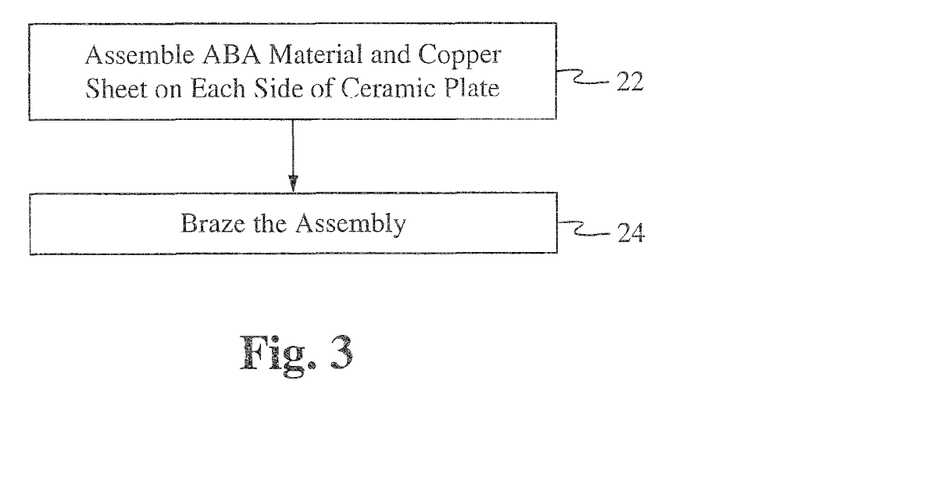
FIG. 3 illustrates an exemplary process for fabricating a ceramic assembly according to the bare ceramic approach.

FIG. 3 illustrates an exemplary process for fabricating a ceramic assembly according to the bare ceramic approach. At the step 22, the copper layer and ABA material are assembled on both sides of the ceramic plate. The ABA material can be either paste of a foil. At the step 24, the copper, ABA material, ceramic plate, ABA material, and copper assembly are vacuum brazed, thereby forming the ceramic assembly. Since the ABAs described in this bonding process contain titanium, the use of forming gas (95% Nitrogen/5% Hydrogen) must be avoided since using such gas in the brazing process with these alloys forms titanium hydride, which prevents chemical bonding of ceramic to copper. The copper layer is made of any conventional copper alloy including, but not limited to, 110, 102, or 101 copper. When the ABA material is Cu-ABA, the brazing temperature is in the range of about 1840 to about 1890 degrees Fahrenheit. When the ABA material is CuSil-ABA, the brazing temperature is in the range of about 1460 to about 1520 degrees Fahrenheit. When the ABA material is InCuSil-ABA, the brazing temperature is in the range of about 1280 to about 1340 degrees Fahrenheit.

Another approach for bonding copper to both sides of a ceramic plate is the metallized ceramic approach which uses a high temperature refractory material including, but not limited to, molybdenum manganese (MoMn), titanium (Ti), or tungsten (W). In some embodiments, the refractory materials, such as MoMn paste, are screen printed onto each side of a ceramic plate. In other embodiments, the refractory materials, such as titanium or tungsten, are deposited by physical vapor deposition (PVD) onto a first side and a second side of a ceramic plate. The next step of metallization is to provide a thin layer coating of electrolytically or electrolessly deposited nickel, thereby forming a metallized ceramic plate. The nickel layer enables joining of the metallized ceramic plate to copper, or electroplating of copper directly onto the metallized ceramic plate. The metallized ceramic approach includes at least two options for bonding the metallized ceramic plate to copper.

Figure 4:
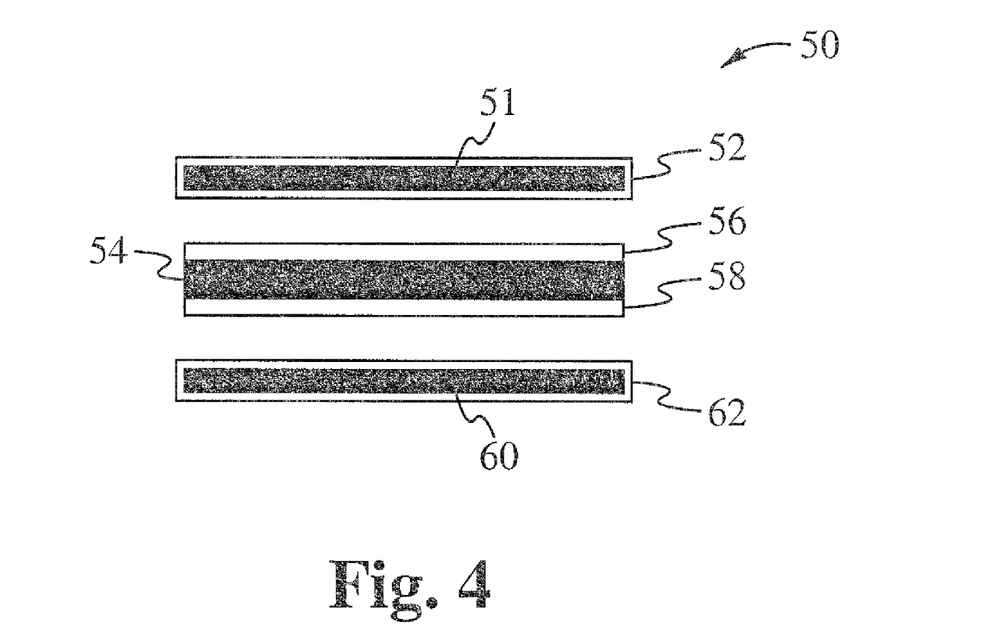
FIG. 4 illustrates a cut-out side view of exemplary layers of a ceramic assembly fabricated using a brazed copper option of a metallized ceramic approach according to a first embodiment, the view shown in FIG. 4 is before a brazing process is performed.

A first option is the brazed copper option where a copper sheet is brazed to both sides of the metallized ceramic plate. In some embodiments, each copper sheet is plated with a thin layer of either silver or gold, which reacts with copper to form CuSil or CuAu, respectively, during bonding. FIG. 4 illustrates a cut-out side view of exemplary layers of a ceramic assembly 50 fabricated using a brazed copper option of a metallized ceramic approach according to a first embodiment, the view shown in FIG. 4 is before a brazing process is performed. The first embodiment of the metallized ceramic approach uses a metallized ceramic plate and plated copper sheets. As shown in FIG. 4, a ceramic plate 54 includes metallized layers 56 and 58. Copper sheet 51 is plated by a layer 52. Copper sheet 60 is plated by a layer 62. In some embodiments, the plated layers 52 and 62 each have a thickness between about 1 micron and about 100 microns. In still other embodiments, the plated layers 52 and 62 each have a thickness of about 10 microns.

Figure 5:
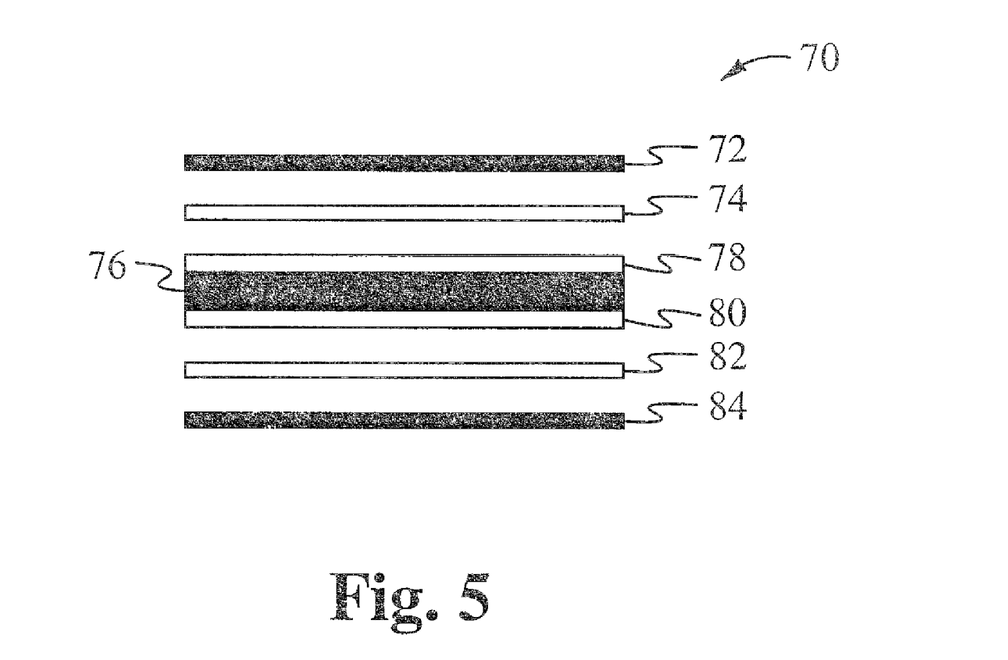
FIG. 5 illustrates a cut-out side view of exemplary layers of a ceramic assembly fabricated using a metallized ceramic approach according to a second embodiment, the view shown in FIG. 5 is before a brazing process is performed.

In other embodiments, a thin sheet of brazing alloy is placed between the metallized ceramic plate and each copper sheet. Examples of brazing alloy sheets include, but are not limited to, copper-silver-based sheets (CuSil sheets) or copper-gold-based sheets (CuAu sheets). FIG. 5 illustrates a cut-out side view of exemplary layers of a ceramic assembly 70 fabricated using a metallized ceramic approach according to a second embodiment, the view shown in FIG. 5 is before a brazing process is performed. The second embodiment of the metallized ceramic approach uses brazing alloy sheets. A first brazing alloy sheet 74 is positioned between a metallized layer 78 of a ceramic plate 76 and a copper sheet 72. A second brazing alloy sheet 82 is positioned between a metallized layer 80 of the ceramic plate 76 and a copper sheet 84. In some embodiments, the thickness of each brazing alloy sheet 74 and 82 is in the range of about 10 microns to about 100 microns. In still other embodiments, the thickness of each brazing alloy sheet 74 and 82 is about 25 microns.

Figure 6:
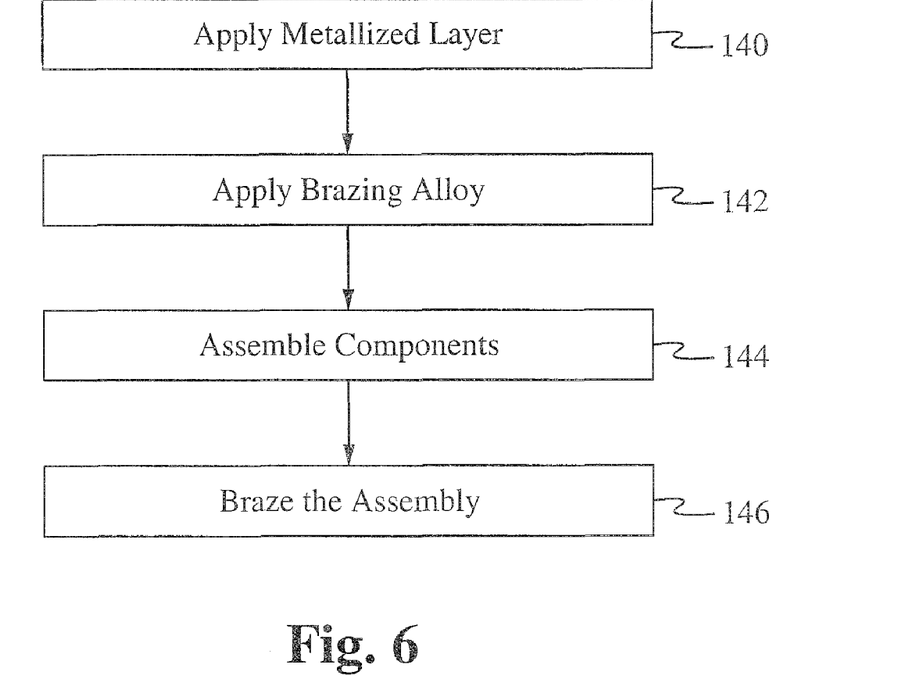
FIG. 6 illustrates an exemplary process for fabricating a ceramic assembly according to the brazed copper option of the metallized ceramic approach.

FIG. 6 illustrates an exemplary process for fabricating a ceramic assembly according to the brazed copper option of the metallized ceramic approach. At the step 140, a metallized layer is applied to a top surface and a bottom surface of a ceramic plate. An exemplary process for applying the metallized layer includes applying a high temperature refractory material ink to the ceramic plate, and firing the ceramic plate and refractory material ink, electroplating a layer of Ni onto the refractory material layer, firing the ceramic plate, refractory material layer, and the Ni plating to form the metallized ceramic plate. The refractory material ink can be applied by screen printing or deposition. In some embodiments, the refractory material layer has a thickness in the range of about 10 microns to about 20 microns, the ceramic plate and refractory material ink are fired at a temperature of 2515 degrees Fahrenheit, the Ni layer has a thickness of about 2 microns, and the ceramic plate, refractory material layer, and Ni plating are fired at a temperature of about 1380 degrees Fahrenheit.

At the step 142, a brazing material is placed between the metallized ceramic layer and each of two copper sheets. In some embodiments, the brazing material is either silver or gold which is plated onto each copper sheet. In other embodiments, the brazing material is a brazing alloy sheet, such as a CuSil sheet or a CuAu sheet, which is positioned between the metallized ceramic plate and each of the copper sheets. In either case, each copper sheet is made of any conventional copper alloy including, but not limited to, 110, 102, or 101 copper. At a step 144, the copper sheet and brazing material are assembled on both sides of the metallized ceramic plate. At the step 146, the assembly from step 144 is vacuum brazed, thereby forming the ceramic assembly. In some embodiments, the brazing temperature of the step 146 is about 1510 degrees Fahrenheit.

Figure 7:
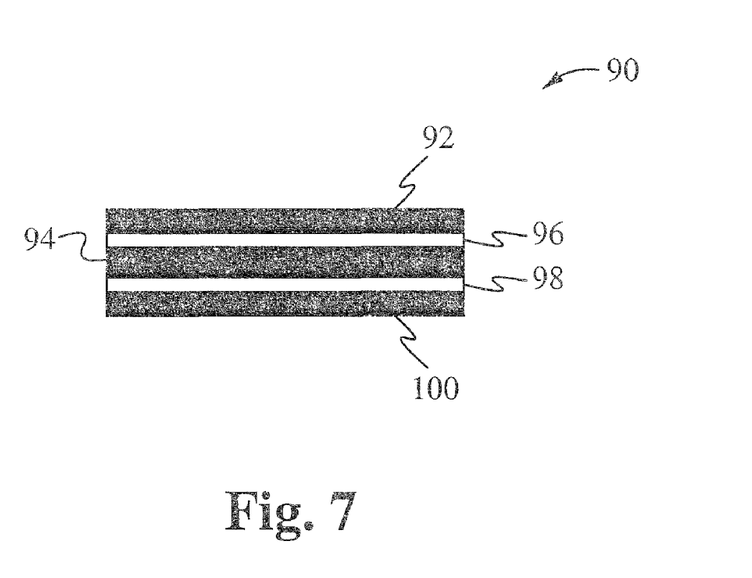
FIG. 7 illustrates a cut-out side view of exemplary layers of a ceramic assembly fabricated using a plated copper option of a metallized ceramic approach according to a third embodiment.

A second option of the metallized ceramic approach for bonding the metallized ceramic plate to copper is the plated copper option which electroplates copper onto both sides of the metallized ceramic plate. FIG. 7 illustrates a cut-out side view of exemplary layers of a ceramic assembly 90 fabricated using a plated copper option of a metallized ceramic approach according to a third embodiment. The third embodiment of the metallized ceramic approach uses a metallized ceramic plate which is then plated with copper. As shown in FIG. 7, a ceramic plate 94 includes metallized layers 96 and 98. Copper is plated on top of the metallized layers 96 and 98 to form plated copper layers 92 and 100.

Figure 8:
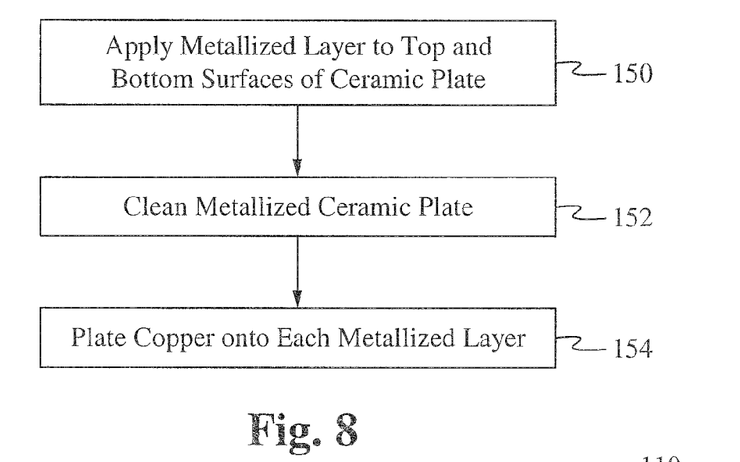
FIG. 8 illustrates an exemplary process for fabricating a ceramic assembly according to the plated copper option of the metallized ceramic approach.

FIG. 8 illustrates an exemplary process for fabricating a ceramic assembly according to the plated copper option of the metallized ceramic approach. At the step 150, a metallized layer is applied to a top surface and a bottom surface of a ceramic plate, thereby forming a metallized ceramic plate. The step 150 is performed in a similar manner as the step 140 of FIG. 6. To enhance adhesion of plated copper, at the step 152, the outer surface on the metallized ceramic plate undergoes a cleaning step to remove the oxide layers. This cleaning step enhances adhesion of plated copper. At the step 154, copper is plated onto each metallized layer of the metallized ceramic plate. Plating installation and fixtures are configured to take into consideration the current distribution aspects to provide uniform deposition of up to 300 micron thick copper layers on both sides of the metallized ceramic layer.

The ceramic assemblies formed by the above methods include a joining layer formed by bonding an intermediate joining material between each copper layer and the ceramic layer. The intermediate joining material provides a strong bonding of copper to the ceramic plate. The intermediate joining material is shown FIGS. 1, 2, 4, 5, and 7 as a discrete layer distinct from the adjoining copper and ceramic layers, this is the condition prior to the brazing process that bonds the copper to the ceramic. Once the brazing process is completed, the intermediate joining material and the surfaces of the adjoining copper and ceramic layers diffuse together to form a mixed interface material, referred to as a joining layer. It is understood that any reference to the bonded joining material after the brazing process is performed is intended to represent the joining layer.

The ceramic assembly described above provides a single device interface surface to which a heat generating device can be coupled. In some applications, multiple heat generating devices are to be coupled to the ceramic assembly. To accommodate multiple heat generating devices, a larger sized ceramic plate is used. In some embodiments, the width of the ceramic plate is about 50 mm and the length of the ceramic plate is about 160 mm. However, if the heat generating devices are coupled to the ceramic assembly with the single device interface surface, there is not electrical isolation between each of the coupled heat generating devices. Therefore, to provide electrical isolation between each of the multiple heat generating devices, electrically isolated copper pads are formed on one side of the ceramic assembly. To electrically isolate each pad, both the copper layer and the joining layer are etched to the ceramic layer. It is necessary to completely etch down to the ceramic layer to provide electrical isolation for each pad. If any joining material remains to connect the pads, electrical isolation is not achieved as the joining layer is electrically conductive.

Photopatterning includes selective removal of material through patterned photoresist and can be accomplished by wet etching or a combination of wet etching and physical methods of material removal, such as laser etching or bead blasting. The copper layer can be easily photopatterned using any conventional wet etch process. However, the joining layer is difficult to photopattern by wet etching. The joining layer can be wet etched but at the expense of over-etching the copper layer because copper is etched at a greater rate than the joining layer. A number of approaches are disclosed to pattern both the copper layer and the joining layer formed between the copper layer and the ceramic layer. The first approach uses a physical etch step. The physical etch step is any conventional physical method for removing material including, but not limited to, laser etching and bead blasting. The physical etch step is used either as part of a two step etching process or a single step etching process. In the two step etching process, a first wet etch step is performed to selectively etch the outer copper layer. A second physical etch step is then performed on the joining layer at the points exposed by the preceding wet etch performed on the copper layer. In the single etch step, a physical etch step is performed to simultaneously etch both the copper layer and the joining layer.

Figure 9:
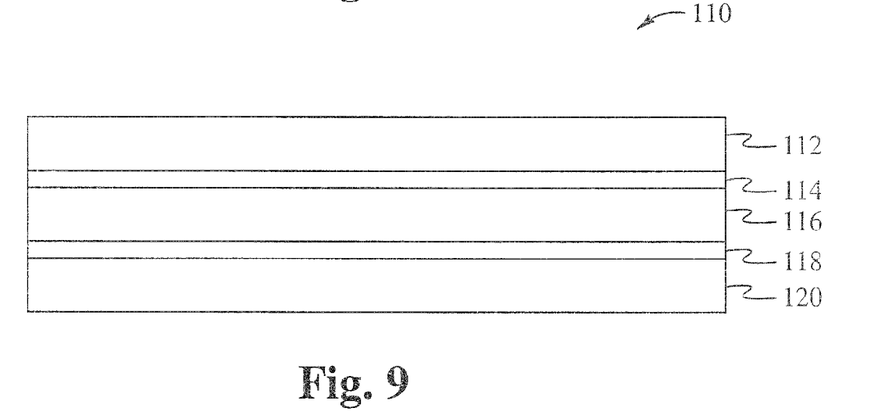
FIG. 9 illustrates a cut out side view of an exemplary ceramic assembly.
Figure 10:
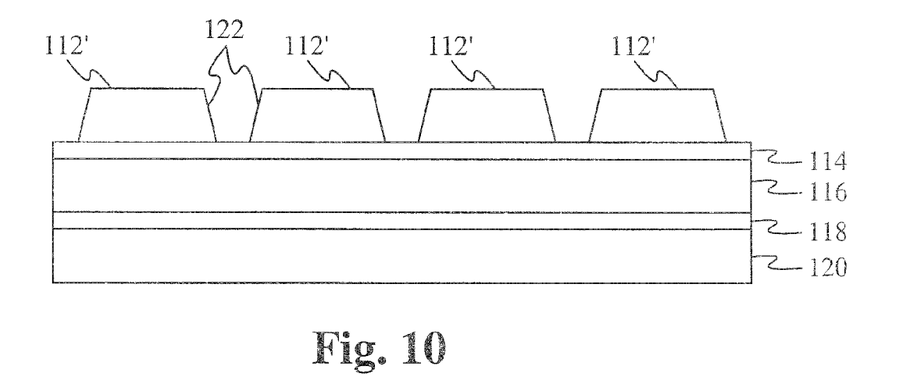
FIGS. 10-11 illustrate two step etching process applied to the exemplary ceramic assembly of FIG. 9.
Figure 11:
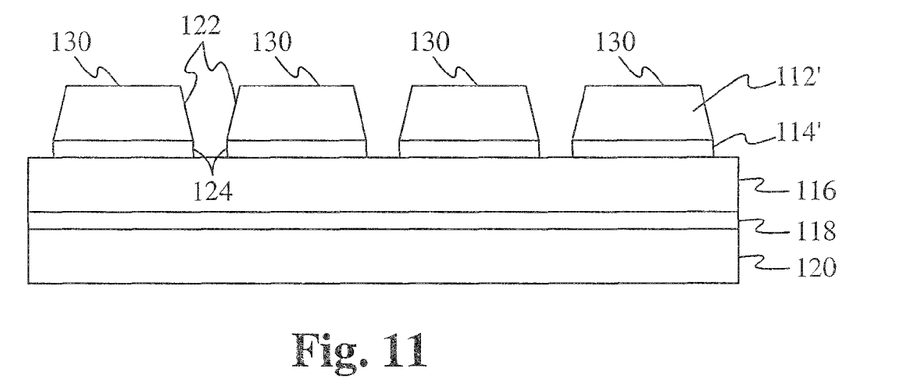
Figure 12:
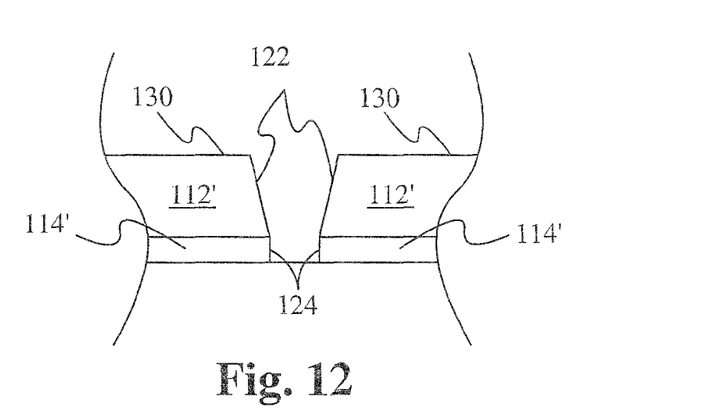
FIG. 12 illustrates a magnified portion of the etched surfaces between two adjacent pads.

FIG. 9 illustrates a cut out side view of an exemplary ceramic assembly 110. FIGS. 10-11 illustrate two step etching process applied to the exemplary ceramic assembly 110. As shown in FIG. 9, a joining layer 114 is formed between a ceramic layer 116 and a copper layer 112, and a joining layer 118 is formed between the ceramic layer 116 and a copper layer 120. FIG. 10 shows a patterned copper layer 112' after an exemplary selective wet etch process is performed. The slopes 122 of the etched copper walls are exaggerated to indicate the effects of the wet etch process. FIG. 11 shows a patterned joining layer 114' after a physical etch process is performed on the portions of the joining layer 114 exposed after the wet etch process. The patterned copper layer 112' and the patterned joining layer 114' form electrically isolated pads 130. The number and dimensions of the pads 130 shown in FIG. 11 is for exemplary purposes only. The slopes 124 of the etched joining layer walls are steeper than the slopes 122 of the etched copper walls. The different slopes are an artifact of the two different etch processes. FIG. 12 illustrates a magnified portion of the etched surfaces between two adjacent pads 130 to better illustrate the difference in the slope 122 of the etched copper wall and the slope 124 of the etched joining layer wall. The slopes 122 and 124 shown in FIGS. 9-12 are for exemplary purposes only.

Figure 13:
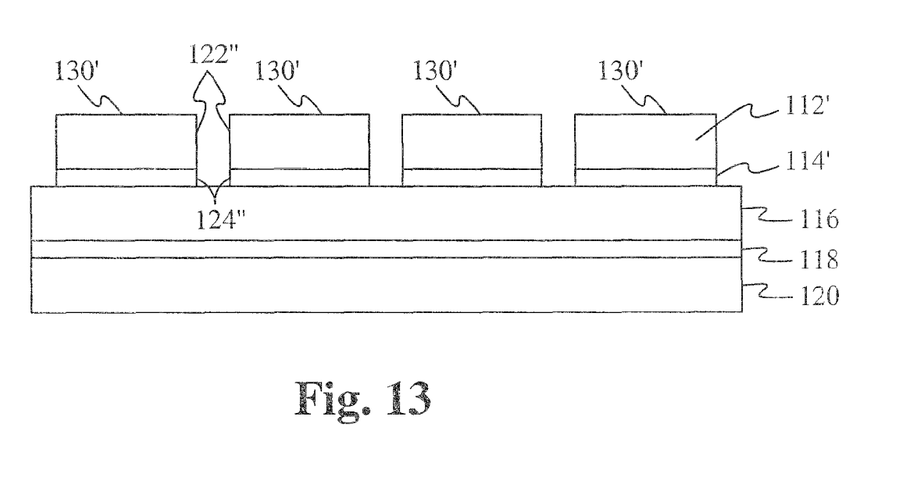
FIG. 13 illustrates the two step etching process applied to the exemplary ceramic assembly of FIG. 9.

FIG. 13 illustrates the two step etching process applied to the exemplary ceramic assembly 110 of FIG. 9. FIG. 13 shows a patterned copper layer 112" and a patterned joining layer 114" after an exemplary selective physical etch process is simultaneously performed on both layers. The patterned copper layer 112" and the patterned joining layer 114" form electrically isolated pads 130'. The number and dimensions of the pads 130' shown in FIG. 13 is for exemplary purposes only. The slopes 122' of the etched copper walls and the slopes 124' of the etched joining layer walls are the same as both are formed using the single step physical etch process.

Figure 14:
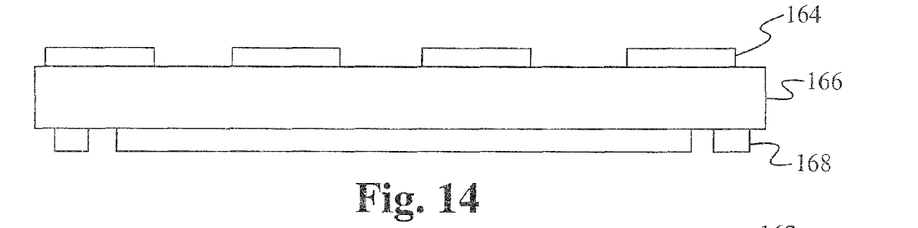
FIGS. 14-17 illustrate the second approach for patterning both the copper layer and the joining layer while fabricating an exemplary ceramic assembly.

A second approach for patterning both the copper layer and the joining layer uses patterned screen printings to selectively apply the intermediate joining material on each side of the ceramic layer. FIGS. 14-17 illustrate the second approach for patterning both the copper layer and the joining layer while fabricating an exemplary ceramic assembly 160. In FIG. 14, a screen printed pattern of intermediate joining material 164 is applied to a first surface of a ceramic plate 166, and a screen printed pattern of intermediate joining material 168 is applied to a second surface of the ceramic plate 166. The intermediate joining material 164 and 168 is either an ink or paste to enable the screen printing application. In some embodiments, the thickness of the intermediate joining material is between several microns to 100s of microns. In still other embodiments, the thickness of the intermediate joining material is about 25 microns. In alternative configurations, the intermediate joining layer 168 is not patterned, similarly to the ceramic assembly 110 in FIGS. 9-13. In general, a ceramic assembly can be patterned on one or both sides depending on the application.

Figure 15:
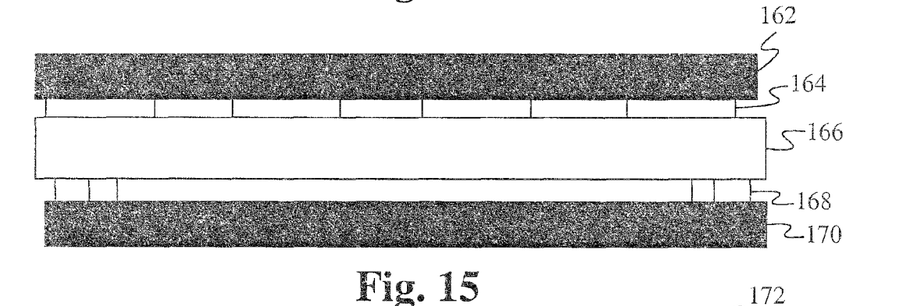

In FIG. 15, a copper sheet 162 is positioned against the patterned intermediate joining material 164, and a copper sheet 170 is positioned against the patterned intermediate joining material 168. The assembly is then brazed. The brazing temperature is determined by the type of intermediate joining material used, such as described in Table 1.

Figure 16:
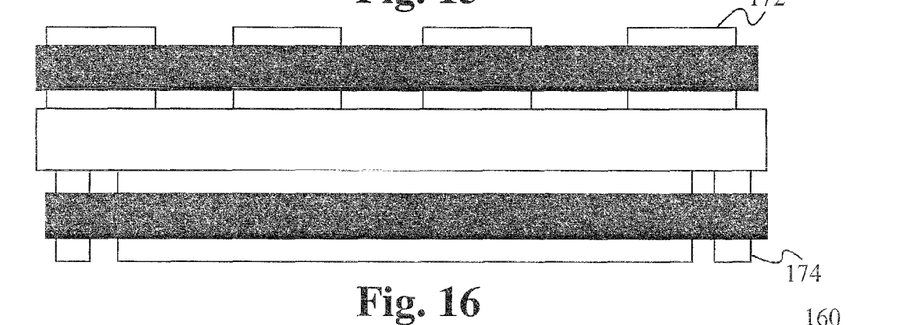

In FIG. 16, a photoresist layer 172 is applied and patterned on the copper sheet 162, and a photoresist layer 174 is applied and patterned on the copper sheet 170. The photoresist layer 172 is patterned to match the patterned joining material 164, and the photoresist layer 174 is patterned to match the patterned joining material 168.

Figure 17:
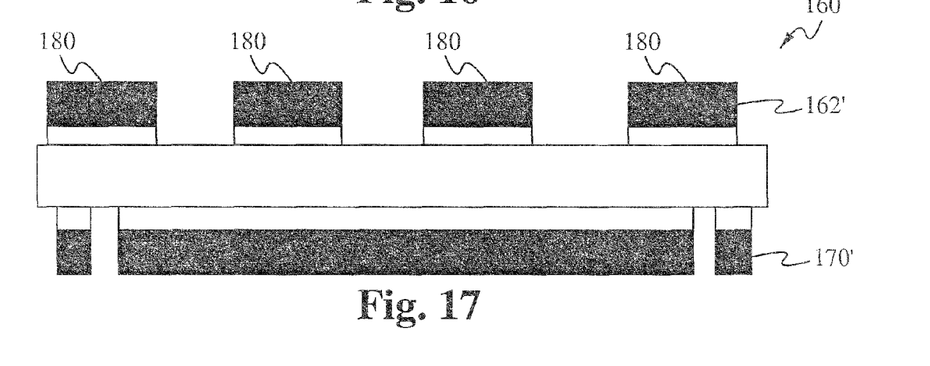

In FIG. 17, the copper sheets 162 and 170 are selectively etched. In some embodiments, the copper sheets are etched using a wet etch process. The photoresist layers 172 and 174 are then removed. The result is a plurality of electrically isolated conductive pads 180. The number and dimensions of the pads 180 shown in FIG. 17 is for exemplary purposes only.

Using either the first approach, shown in FIGS. 9-13, or the second approach, shown in FIGS. 14-17, electrical isolation of the conductive pads can be verified by measuring resistivity between the pads. The final step in fabricating the ceramic assembly is laser machining of the assembly to provide drilled alignment holes and final shaping of the assembly.

B. Fabrication of the Microheat Exchanger

The microheat exchanger is made of a thermally conductive material. In some embodiments, the microheat exchanger is made of copper. The microheat exchanger includes fluid pathways that enable fluid flow through the microheat exchanger. Heat is transferred from the thermally conductive material to fluid flowing through the microheat exchanger. The microheat exchanger includes one or more fluid input ports and one or more fluid output ports to enable fluid flow into and out of the microheat exchanger. In some embodiments, fluid pathways within the microheat exchanger are formed from cross hatched patterned fin design to provide flow uniformity either across the entire microheat exchanger or to select portions of the microheat exchanger. When the microheat exchanger is coupled to the ceramic assembly, the fluid pathways are designed to provide flow uniformity over the length of each heat generating device coupled to the conductive pads on the ceramic assembly. In some embodiments, the patterned fins are brazed to the microheat exchanger body using a CuSil sheet. In some embodiments, the thickness of the CuSil sheet is in the range of about 10 micrometer to about 100 micrometers. In still other embodiments, the thickness of the CuSil sheet is about 25 microns. It is understood that any conventional microheat exchanger that includes fluid flow therethrough can be used.

C. Fabrication of the Microheat Exchanging Assembly

Final assembly involves placing and aligning a first ceramic assembly, the microheat exchanger, and a second ceramic assembly in a fixture and brazing the fixed assembly in a vacuum or forming gas furnace. In some embodiments, only a single ceramic assembly is brazed to the microheat exchanger. A joining material is used to braze each ceramic assembly to the microheat exchanger. Where the microheat exchanger is made of copper and the bottom conducting layer of the ceramic assembly is also a copper layer, the joining material is a copper-to-copper joining material. In some embodiments, the joining material is a CuSil paste or CuSil foil. In an exemplary application, an eutectic CuSil joining material is made of 72% silver and 28% copper, having a melting temperature of 1435 degrees Fahrenheit. Using this CuSil joining material, a brazing temperature is about 1420 degrees Fahrenheit. Using a brazing process the joining material "flows" into the microvoids on the contact surfaces. Also, the brazing temperature and pressure for bonding the ceramic assembly to the microheat exchanger is lower than the brazing temperature and pressure used to fabricate the ceramic assembly. As such, using two separate fabrication steps, one to fabricate the ceramic assembly and another to fabricate the microheat exchanging assembly, does not put the microheat exchanger under as high a temperature or pressure, which reduces the chance of deformation. In other embodiments, the joining material is a solder paste or a solder foil. In general, any conventional metal-to-metal joining material can be used. In some embodiments, the thickness of the joining material is in the range of about 10 micrometer to about 100 micrometers. In still other embodiments, the thickness of the joining material is about 25 microns. In an alternative approach, instead of applying a separate joining material, the microheat exchanger body is plated with silver which forms CuSil during brazing. In some embodiments, the silver plating thickness is between about 1 micron and about 100 microns. In still other embodiments, the thickness of the silver plating is about 10 microns.

Figure 18:
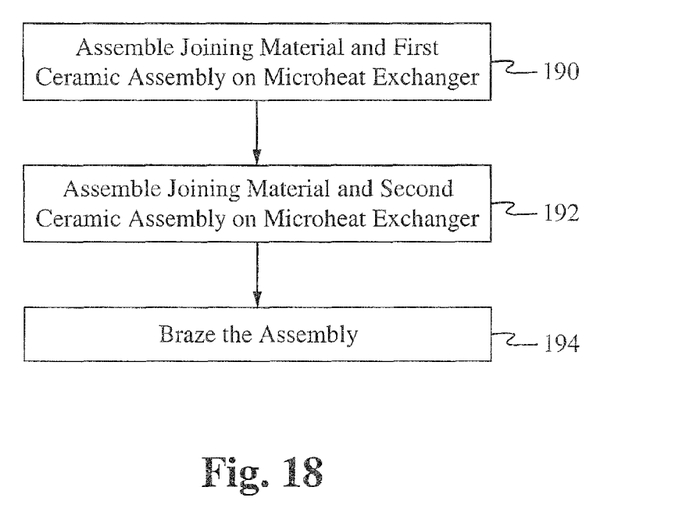
FIG. 18 illustrates an exemplary process for fabricating a microheat exchanging assembly according to an embodiment.

FIG. 18 illustrates an exemplary process for fabricating a microheat exchanging assembly according to an embodiment. At the step 190, a first ceramic assembly and a joining material are assembled on a first surface of a microheat exchanger. At the step 192, a second ceramic assembly and a joining material are assembled on a second surface of the microheat exchanger. The joining material can be either paste or a foil. In some embodiments, one or more surfaces of the first ceramic assembly are patterned. In other embodiments, one or more surfaces of both the first ceramic assembly and the second ceramic assembly are patterned. In still other embodiments, the step 192 is not performed and only a single ceramic assembly and joining material are assembled to the microheat exchanger. At the step 194, the first ceramic assembly, the joining material, the microheat exchanger, the joining material, and the second ceramic assembly are brazed, thereby forming the microheat exchanging assembly.

Figure 19:
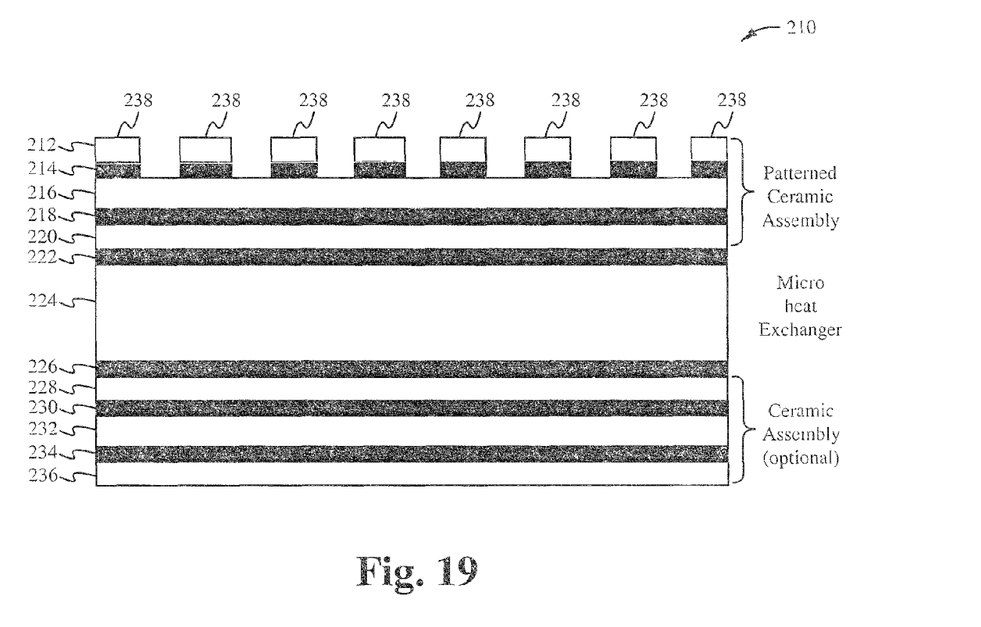
FIG. 19 illustrates a cut-out side view of exemplary layers of a completed microheat exchanging assembly with the ceramic assemblies fabricated using the bare ceramic approach.

FIG. 19 illustrates a cut-out side view of exemplary layers of a completed microheat exchanging assembly 210 with the ceramic assemblies fabricated using the bare ceramic approach. The microheat exchanging assembly 210 includes a patterned ceramic assembly bonded to a first surface of a microheat exchanger 224, and a ceramic assembly bonded to a second surface of the microheat exchanger 224. The patterned ceramic assembly includes a patterned copper layer 212, a patterned ABA joining layer 214, a ceramic plate 216, an ABA joining layer 218, and a copper layer 220. The copper layer 212 and the joining layer 214 are patterned to form electrically isolated conductive pads 238. The copper layer 220 is bonded to the microheat exchanger 224 via joining layer 222. The ceramic assembly includes a copper layer 228, an ABA joining layer 230, a ceramic plate 232, an ABA joining layer 234, and a copper layer 236. The copper layer 228 is bonded to the microheat exchanger 224 via joining layer 226. Although only the copper layer 212 and the joining layer 214 are shown to be patterned in FIG. 19, it is understood that the copper layer 220 and the joining layer 218, the copper layer 228 and the joining layer 230, and/or the copper layer 236 and the joining layer 234 can be patterned according to the application.

As describe above in the bare ceramic approach of fabricating the ceramic assembly, the ABA joining material can be applied as a foil or a paste. In some embodiments, the ABA joining material is Cu-ABA, CuSil-ABA, or InCuSil-ABA. In some embodiments, the joining material used for the joining layers 222 and 226 is a CuSil paste or a CuSil foil. In other embodiments, the joining material is a solder paste or a solder foil. In general, any conventional metal-to-metal joining material can be used.

Figure 20:
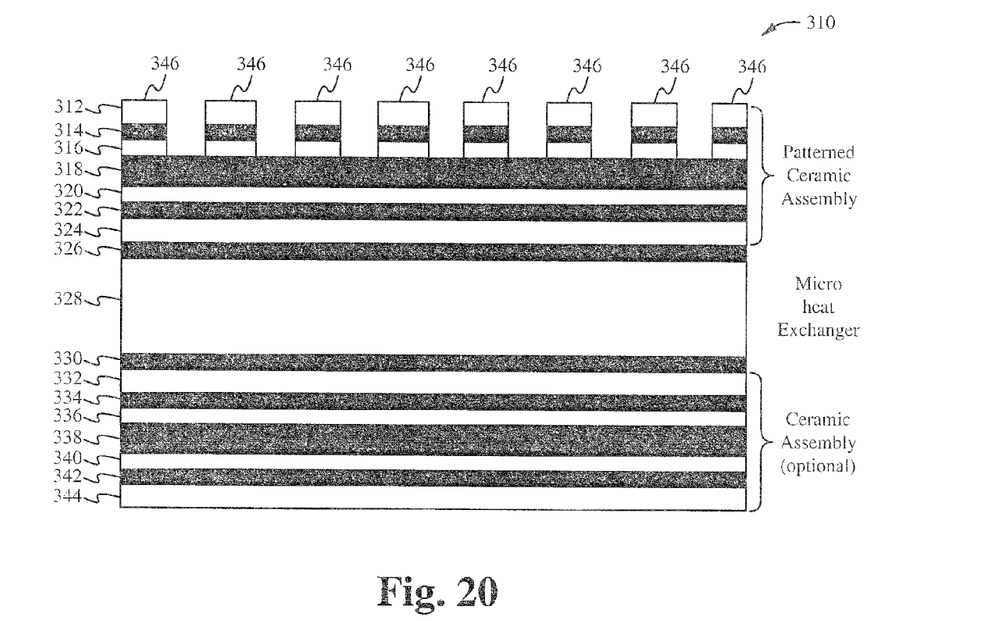
FIG. 20 illustrates a cut-out side view of exemplary layers of a completed microheat exchanging assembly with the ceramic assemblies fabricated using the brazed copper option of the metallized ceramic approach.

FIG. 20 illustrates a cut-out side view of exemplary layers of a completed microheat exchanging assembly 310 with the ceramic assemblies fabricated using the brazed copper option of the metallized ceramic approach. The microheat exchanging assembly 310 includes a patterned ceramic assembly bonded to a first surface of a microheat exchanger 328, and a ceramic assembly bonded to a second surface of the microheat exchanger 328. The patterned ceramic assembly includes a patterned copper layer 312, a patterned joining layer 314, a metallized layer 316, a ceramic plate 318, a metallized layer 320, a joining layer 322, and a copper layer 324. The copper layer 312, the joining layer 314, and the metallized layer 316 are patterned to form electrically isolated conductive pads 346. The copper layer 324 is bonded to the microheat exchanger 328 via joining layer 326. The ceramic assembly includes a copper layer 332, a joining layer 334, a metallized layer 336, a ceramic plate 338, a metallized layer 340, a joining layer 342, and a copper layer 344. The copper layer 332 is bonded to the microheat exchanger 328 via joining layer 330. Although only the copper layer 312, the joining layer 314, and the metallized layer 316 are shown to be patterned in FIG. 20, it is understood that the copper layer 324, the joining layer 322, and the metallized layer 320, the copper layer 332, the joining layer 334, and the metallized layer 336, and/or the copper layer 344, the joining layer 342, and the metallized layer 340 can be patterned according to the application.

As describe above in the brazed copper option of the metallized ceramic approach for fabricating the ceramic assembly, the metallized layer includes refractory materials, such as molybdenum manganese (MoMn), titanium (Ti), or tungsten (W), plated with nickel. The joining material used to form the joining layers 314, 322, 334, and 342 can be applied as a foil or a paste. In some embodiments, the joining material is a CuSil or CuAu paste or a CuSil or CuAu foil. In other embodiments, the joining material and copper layer are combined as a silver plated copper sheet. In some embodiments, the joining material used for the joining layers 326 and 330 is a CuSil paste or a CuSil foil. In other embodiments, the joining material is a solder paste or a solder foil. In general, any conventional metal-to-metal joining material can be used for the joining layers 326 and 330.

Figure 21:
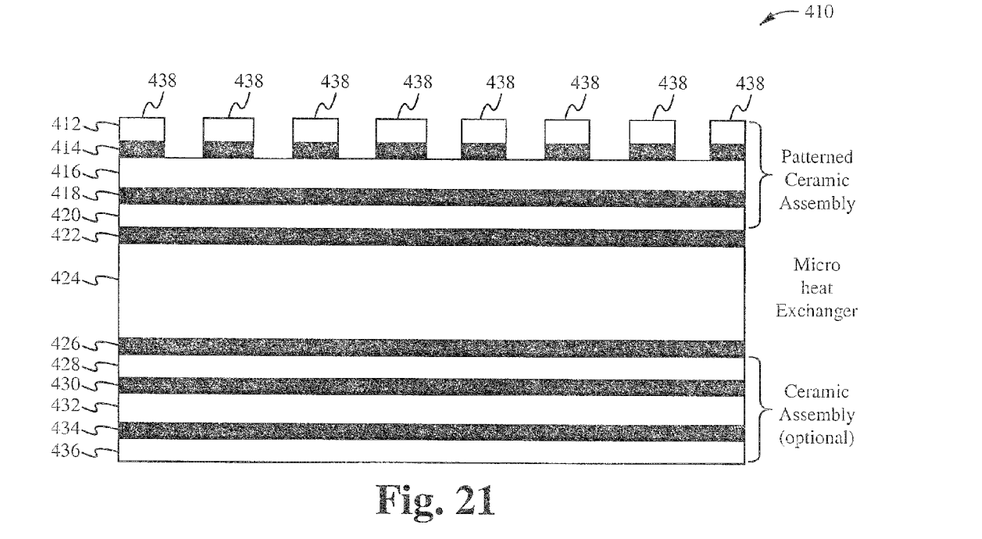
FIG. 21 illustrates a cut-out side view of exemplary layers of a completed microheat exchanging assembly with the ceramic assemblies fabricated using the plated copper option of the metallized ceramic approach.

FIG. 21 illustrates a cut-out side view of exemplary layers of a completed microheat exchanging assembly 410 with the ceramic assemblies fabricated using the plated copper option of the metallized ceramic approach. The microheat exchanging assembly 410 includes a patterned ceramic assembly bonded to a first surface of a microheat exchanger 424, and a ceramic assembly bonded to a second surface of the microheat exchanger 424. The patterned ceramic assembly includes a patterned copper layer 412, a patterned metallized layer 414, a ceramic plate 416, a metallized layer 418, and a copper layer 420. The copper layer 412 and the metallized layer 414 are patterned to form electrically isolated conductive pads 438. The copper layer 420 is bonded to the microheat exchanger 424 via joining layer 422. The ceramic assembly includes a copper layer 428, a metallized layer 430, a ceramic plate 432, a metallized layer 434, and a copper layer 436. The copper layer 428 is bonded to the microheat exchanger 424 via joining layer 426. Although only the copper layer 412 and the metallized layer 414 are shown to be patterned in FIG. 21, it is understood that the copper layer 420 and the metallized layer 418, the copper layer 428 and the metallized layer 430, and/or the copper layer 436 and the metallized layer 434 can be patterned according to the application.

As describe above in the plated copper option of the metallized ceramic approach for fabricating the ceramic assembly, the metallized layer includes refractory materials, such as molybdenum manganese (MoMn), titanium (Ti), or tungsten (W), plated with nickel. The joining material can be applied as a foil or a paste. In some embodiments, the joining material is a CuSil or CuAu paste or a CuSil or a CuAu foil. In other embodiments, the joining material is a solder paste or a solder foil. In general, any conventional metal-to-metal joining material can be used for the joining layers 422 and 426.

The microheat exchanging assemblies are described above as bonding an outer surface of the ceramic assembly to an outer surface of the microheat exchanger via a joining material. In alternative embodiments, an intermediate layer, layers stack, block, or device, such as an additional microheat exchanger, can be positioned between the ceramic assembly and the microheat exchanger, where the intermediate layer, layers stack, block, or device is thermally conductive and includes outer surfaces conducive for bonding with the outer surface of the ceramic assembly and the outer surface of the microheat exchanger as described above.

The ceramic assembly has been described in terms of specific embodiments incorporating details to facilitate the understanding of the principles of construction and operation of the bonded plate. Such reference herein to specific embodiments and details thereof is not intended to limit the scope of the claims appended hereto. It will be apparent to those skilled in the art that modifications may be made in the embodiment chosen for illustration without departing from the spirit and scope of the bonded plate.

What is claimed is:

1. A device comprising:
    a. a first copper layer;
    b. a ceramic layer;
    c. a second copper layer;
    d. a first active brazing alloy layer bonded between the first copper layer and the ceramic layer to form a first joining layer, wherein the first copper layer and the first joining layer are configured to form a plurality of electrically isolated conductive pads, wherein each of the plurality of electrically isolated pads includes an etched wall extending from a first surface of the first copper layer through the first copper layer and the first joining layer to a first surface of the ceramic layer, the first surface of the first copper layer is distal from the first joining layer, and the first surface of the ceramic layer is proximate to the first joining layer, further wherein a slope of the etched wall through the first joining layer is steeper than a slope of the etched wall through the first copper layer; and
    e. a second active brazing alloy layer bonded between the ceramic layer and the second copper layer to form a second joining layer.

2. The device of claim 1 wherein the first copper layer and the first joining layer are etched to form a plurality of electrically isolated conductive pads, further wherein each of the plurality of electrically isolated pads are electrically isolated from each other and from the second copper layer by the ceramic layer.

3. The device of claim 1 wherein the ceramic layer comprises beryllium oxide, aluminum oxide, or aluminum nitride.

4. The device of claim 1 wherein the first active brazing alloy layer and the second active brazing alloy layer comprise a copper-based active brazing alloy, a copper-silver-based active brazing alloy, or an indium-copper-silver-based active brazing alloy.

5. The device of claim 1 wherein the first active brazing alloy layer is comprised of an active joining material paste and the second active brazing alloy layer is comprised of the active joining material paste, or the first active brazing alloy layer is comprised of an active joining material foil and the second active brazing alloy layer is comprised of the active joining material foil.

* * * * *